(12) United States Patent
Chan et al.

(10) Patent No.: US 11,081,417 B2
(45) Date of Patent: Aug. 3, 2021

(54) MANUFACTURING A PACKAGE USING PLATEABLE ENCAPSULANT

(71) Applicant: Infineon Technologies AG, Neubiberg (DE)

(72) Inventors: Sook Woon Chan, Melaka (MY); Chau Fatt Chiang, Melaka (MY); Kok Yau Chua, Melaka (MY); Soon Lock Goh, Malacca (MY); Swee Kah Lee, Melaka (MY); Joachim Mahler, Regensburg (DE); Mei Chin Ng, Melaka (MY); Beng Keh See, Melaka (MY); Guan Choon Matthew Nelson Tee, Malacca (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/514,853

(22) Filed: Jul. 17, 2019

(65) Prior Publication Data
US 2019/0341324 A1 Nov. 7, 2019

Related U.S. Application Data

(63) Continuation of application No. 15/448,018, filed on Mar. 2, 2017, now Pat. No. 10,396,007.

(30) Foreign Application Priority Data

Mar. 3, 2016 (DE) ...................... 10 2016 103 790.7

(51) Int. Cl.
*H01L 23/552* (2006.01)
*H01L 23/31* (2006.01)
(Continued)

(52) U.S. Cl.
CPC .......... *H01L 23/3192* (2013.01); *C09D 5/002* (2013.01); *C09D 5/24* (2013.01);
(Continued)

(58) Field of Classification Search
CPC ... H01L 23/3192; H01L 23/295; H01L 21/56; H01L 21/568; H01L 23/293;
(Continued)

(56) References Cited

U.S. PATENT DOCUMENTS

| 6,866,919 B2 | 3/2005 | Ikeguchi et al. |
| 7,288,327 B2 | 10/2007 | Daniel et al. |

(Continued)

FOREIGN PATENT DOCUMENTS

| CN | 101211898 A | 7/2008 |
| DE | 10017887 C1 | 3/2002 |

(Continued)

OTHER PUBLICATIONS

"Injection Molded & Micro Fabrication Electronic Packaging", Author: Dr. Ken Gilleo / ET-Trends LLC/ Warnick, RI/ Dennis Jones/ Matrix, Inc. / Providence, RI; Publication 2005; Link: http://et-trends.com/files/Molding-2005-Jones-Gilleo.pdf.

(Continued)

*Primary Examiner* — Ismail A Muse

(57) ABSTRACT

A method of manufacturing a package, comprising embedding the semiconductor chip with an encapsulant comprising a transition metal in a concentration in a range between 10 ppm and 10,000 ppm; selectively converting of a part of the transition metal, such that the electrical conductivity of the encapsulant increases; and plating the converted part of the encapsulant with an electrically conductive material.

17 Claims, 21 Drawing Sheets

(51) Int. Cl.
*C09D 5/24* (2006.01)
*C23C 18/16* (2006.01)
*C23C 18/18* (2006.01)
*H01L 23/29* (2006.01)
*C09D 5/00* (2006.01)
*C09D 201/00* (2006.01)
*C23C 18/34* (2006.01)
*H01L 21/56* (2006.01)
*H01L 23/66* (2006.01)
*H01L 23/00* (2006.01)

(52) U.S. Cl.
CPC .......... *C09D 201/00* (2013.01); *C23C 18/166* (2013.01); *C23C 18/1608* (2013.01); *C23C 18/1612* (2013.01); *C23C 18/1637* (2013.01); *C23C 18/1689* (2013.01); *C23C 18/182* (2013.01); *C23C 18/1831* (2013.01); *C23C 18/1837* (2013.01); *C23C 18/1868* (2013.01); *C23C 18/1879* (2013.01); *C23C 18/1882* (2013.01); *C23C 18/34* (2013.01); *H01L 21/56* (2013.01); *H01L 21/568* (2013.01); *H01L 23/293* (2013.01); *H01L 23/295* (2013.01); *H01L 23/552* (2013.01); *H01L 23/66* (2013.01); *H01L 24/16* (2013.01); *C23C 18/1834* (2013.01); *H01L 2223/6677* (2013.01); *H01L 2224/16501* (2013.01); *H01L 2224/97* (2013.01); *H01L 2924/15313* (2013.01); *H01L 2924/1815* (2013.01); *H01L 2924/3025* (2013.01)

(58) Field of Classification Search
CPC ....... H01L 23/552; H01L 23/66; H01L 24/16; H01L 2224/97; H01L 2924/15313; H01L 2924/1815; H01L 2924/3025; H01L 2223/6677; H01L 2224/16501; H01L 23/3107; H01L 23/3142; C09D 5/24; C09D 5/002; C09D 201/00; C23C 18/1608; C23C 18/1612; C23C 18/1831; C23C 18/1868; C23C 18/1879; C23C 18/1882; C23C 18/1637; C23C 18/166; C23C 18/1689; C23C 18/182; C23C 18/1837; C23C 18/34; C23C 18/1834
See application file for complete search history.

(56) References Cited

U.S. PATENT DOCUMENTS

| | | | |
|---|---|---|---|
| 7,298,047 B2 | 11/2007 | Kawakami et al. | |
| 7,449,412 B2 | 11/2008 | Nuytkens et al. | |
| 7,632,753 B1 | 12/2009 | Rusli et al. | |
| 7,795,554 B2 | 9/2010 | Kim | |
| 8,587,099 B1 | 11/2013 | Abbott | |
| 8,946,746 B2 | 2/2015 | Fukunaga et al. | |
| 2008/0241514 A1* | 10/2008 | Yusa | C23C 18/1641 428/328 |
| 2009/0019687 A1 | 1/2009 | Tseng | |
| 2009/0065586 A1 | 3/2009 | Tasaki et al. | |
| 2009/0239079 A1 | 9/2009 | Wojtaszek | |
| 2011/0073648 A1 | 3/2011 | Kobayashi et al. | |
| 2011/0100453 A1* | 5/2011 | Clevenger | H01L 31/02164 136/256 |
| 2012/0243191 A1 | 9/2012 | Wu | |
| 2014/0120263 A1 | 5/2014 | Yee et al. | |
| 2014/0217564 A1 | 8/2014 | Gaynor et al. | |
| 2014/0217607 A1 | 8/2014 | Uzoh et al. | |
| 2014/0231266 A1 | 8/2014 | Sherrer et al. | |
| 2015/0076670 A1 | 3/2015 | Pan et al. | |
| 2015/0187705 A1 | 7/2015 | Chung | |
| 2015/0221526 A1 | 8/2015 | Abbott | |
| 2015/0221578 A1* | 8/2015 | Mahler | H01L 21/565 257/734 |
| 2017/0133563 A1 | 5/2017 | Chung et al. | |
| 2017/0287851 A1 | 10/2017 | Prakash et al. | |
| 2018/0114762 A1 | 4/2018 | Chiu et al. | |
| 2018/0182736 A1 | 6/2018 | Eid et al. | |

FOREIGN PATENT DOCUMENTS

| | | |
|---|---|---|
| WO | 01/77410 A2 | 10/2001 |
| WO | 2009134009 A2 | 11/2009 |

OTHER PUBLICATIONS

"Selective metallization of polymers using laser induced surface activation (LISA)-characterization and optimization of porous surface topography", Author: Yang Zhang / Hans N. Hansen / Arnaud De Grave /Peter T. Tang / Jacob S. Nielsen; Publication: Dec. 2010: Link: http://www.researchgate.net/publication/241055418_Selective_metallization_of_polymers_using_laser_induced_surface_activation_(LISA)characterization_and_optimization_of_porous_surface_topography.

"Deposition on Nonoonduotors", Author: University of Wndsor, Windsor Ontario, Canada; Publication; Oct. 2015; Link: https://www.researchgate.net/publication/229537270_Deposition_on_Nonoonduotors.

* cited by examiner

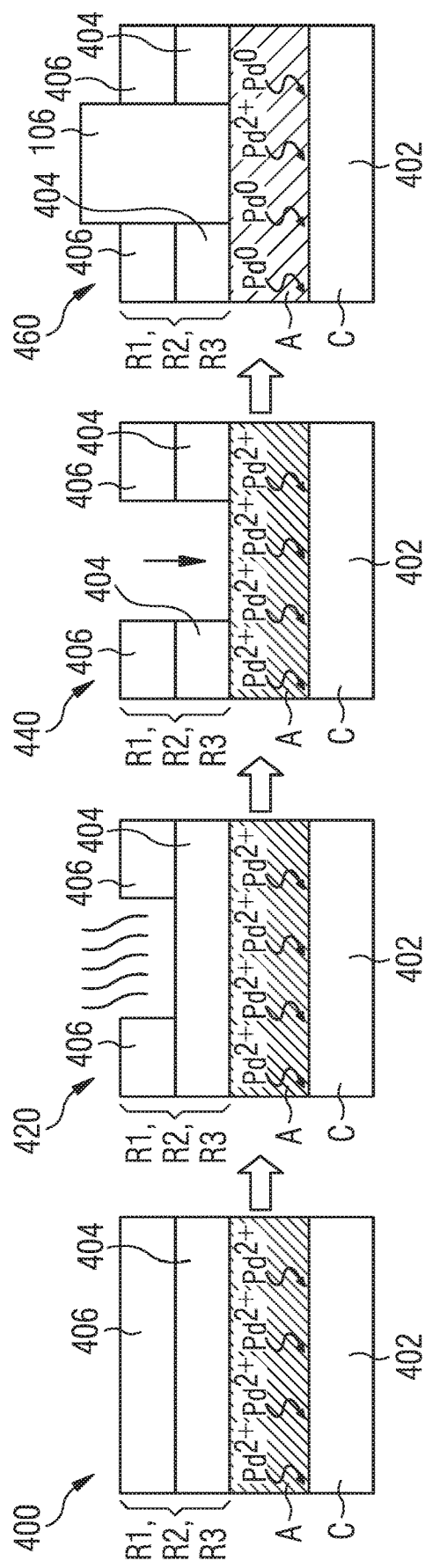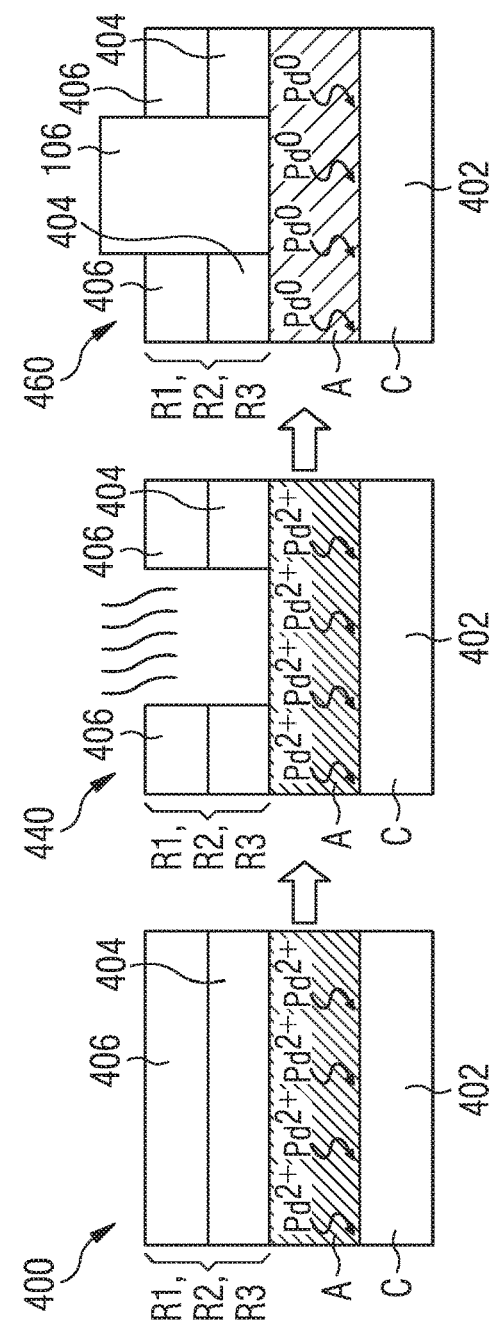

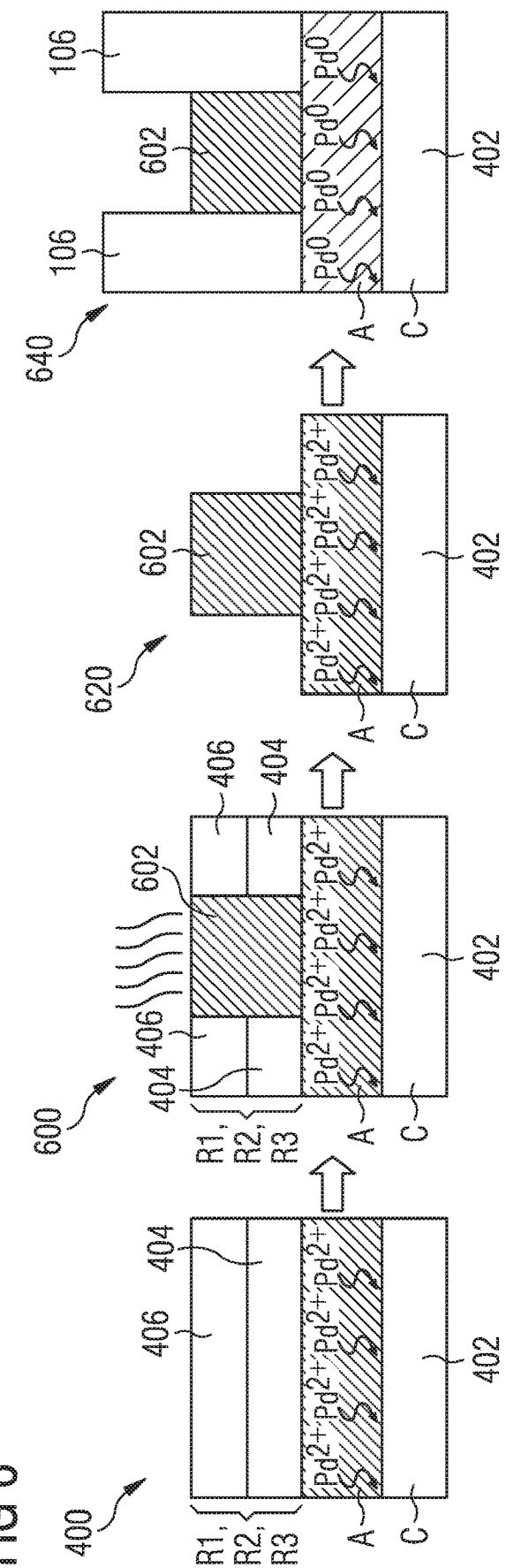

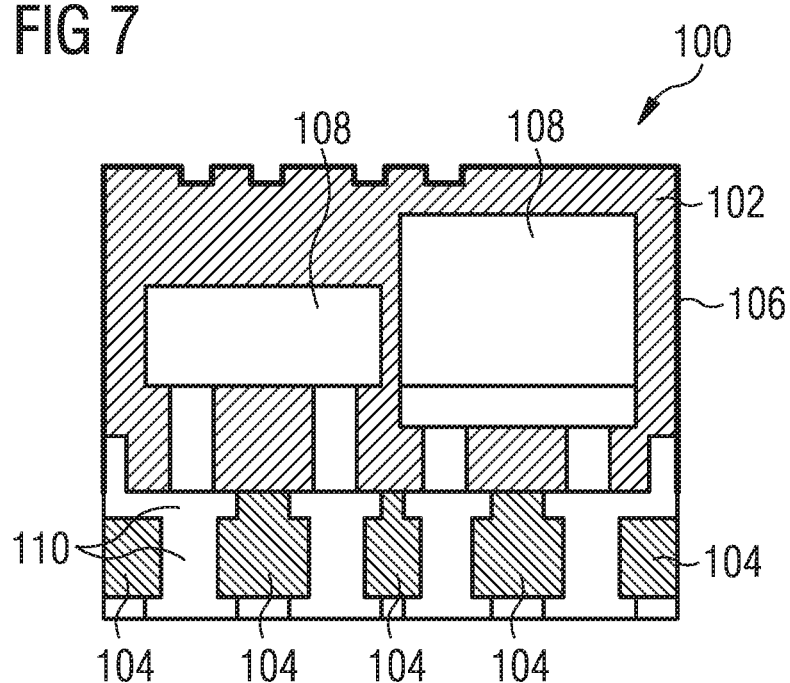
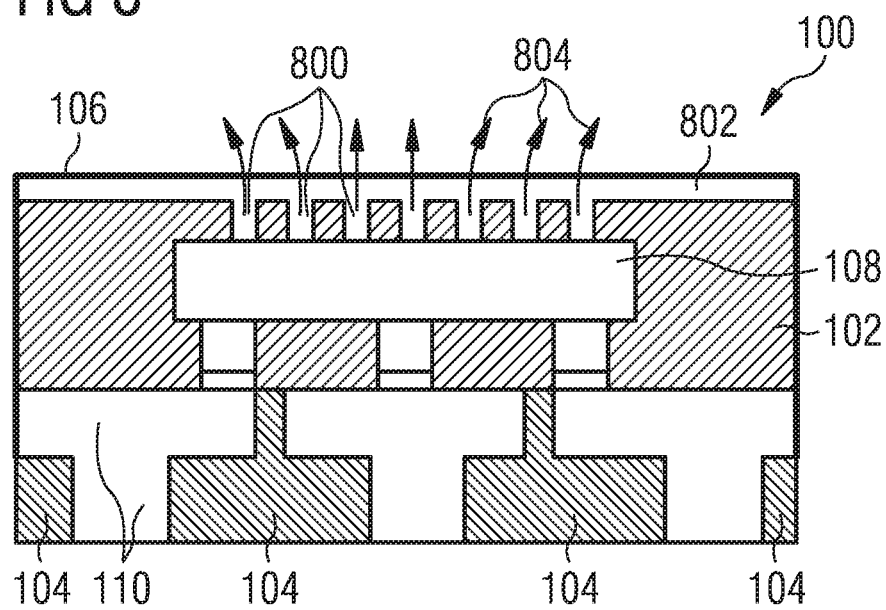

MANUFACTURING A PACKAGE USING PLATEABLE ENCAPSULANT

BACKGROUND OF THE INVENTION

Field of the Invention

The present invention relates to a package, a method of manufacturing a package, in particular a semiconductor package, a premix of a plateable encapsulant, a method of manufacturing a plateable encapsulant, an encapsulant, and a method of manufacturing an encapsulant.

Description of the Related Art

Packages may be denoted as encapsulated electronic chips with electrical connects extending out of the encapsulant and being mounted to an electronic periphery, for instance on a printed circuit board.

Packaging cost is an important driver for the industry. Related with this are performance, dimensions and reliability. The different packaging solutions are manifold and have to address the needs of the application. There are applications, where high performance is required, others, where reliability is the top priority—but all requires lowest possible cost.

SUMMARY OF THE INVENTION

There may be a need to manufacture packages in a simple and reliable manner.

According to an exemplary embodiment, a method of manufacturing a package is presented. The method comprises electrically coupling of a redistribution layer with at least one semiconductor chip embedding the semiconductor chip with an encapsulant, which is a mold compound and comprising a transition metal in a concentration in a range between 10 ppm and 10,000 ppm, selectively converting of a part of the transition metal, such that the electrical conductivity of the encapsulant increases, and plating of an outer lateral sidewall of the converted encapsulant with an electrically conductive material for providing an electrical conductive coupling to the redistribution layer and an electronic periphery, that is at least partially localized at an surface of the package.

According to another exemplary embodiment a package is presented, comprising at least one semiconductor chip, a redistribution layer electrically coupled with the semiconductor chip and an encapsulant in which the semiconductor chip is embedded, wherein the encapsulant is a mold compound and comprises a transition metal in a concentration in a range between 10 ppm and 10,000 ppm. A part of the transition metal is selectively converted, such that the electrical conductivity of the encapsulant is increased, wherein the converted encapsulant comprises an outer lateral sidewall which is plated with an electrically conductive material for providing an electrical conductive coupling to the redistribution layer and an electronic periphery, that is at least partially localized at an surface of the package.

According to an exemplary embodiment, a package (in particular a semiconductor package) is provided which comprises a first encapsulant configured so that electrically conductive material is plateable thereon, and a second encapsulant (in particular made of another material than the first encapsulant) configured so that electrically conductive material is not plateable thereon.

According to another exemplary embodiment, a method of manufacturing a package is provided, wherein the method comprises forming a first encapsulant configured so that electrically conductive material is plateable (in particular is plateable in an electroless manner) thereon, forming a second encapsulant configured so that electrically conductive material is not plateable thereon, and plating (in particular electroless plating) electrically conductive material selectively on a surface of the first encapsulant without plating electrically conductive material on a surface of the second encapsulant.

According to yet another exemplary embodiment, a premix of a plateable encapsulant is provided, wherein the premix comprises a transition metal, a polymer cluster, and a coupling agent between the transition metal and the polymer cluster.

According to still another exemplary embodiment, a method of manufacturing a plateable encapsulant is provided, wherein the method comprises providing a transition metal-polymer compound comprising a transition metal and a polymer cluster, removing a surface portion of the polymer cluster to thereby expose the transition metal, and activating an exposed surface of the transition metal.

According to still another exemplary embodiment, an encapsulant for encapsulating a semiconductor chip is provided, wherein the encapsulant comprises an electrically insulating encapsulant base material, and an activatable plating catalyst being convertible from a deactivated state, in which the encapsulant is non-plateable with electrically conductive material, into an activated state, in which the encapsulant is plateable with electrically conductive material.

According to yet another exemplary embodiment, a method of manufacturing an encapsulant is provided, wherein the method comprises providing a compound (such as a material composition, in particular a solid compound) comprising an electrically insulating encapsulant base material and an activatable plating catalyst in a deactivated state, in which the compound is non-plateable with electrically conductive material, and converting at least part of the plating catalyst from the deactivated state into an activated state, in which the compound is plateable with electrically conductive material.

According to still another exemplary embodiment, a plateable first encapsulant and a non-plateable second encapsulant are used for a package comprising an integrated antenna.

According to an exemplary embodiment of one aspect of the invention, a first section of a package is formed by a plateable encapsulant, on which plating (in particular electroless plating) of electrically conductive material is enabled, and another section of the package is formed by a non-plateable encapsulant, on which plating (in particular electroless plating) of electrically conductive material is disabled. This allows to carry out a simple plating process which will selectively result in an electrically conductive layer only on an exterior surface of the plateable encapsulant, not on an exterior surface of the non-plateable encapsulant. Cumbersome patterning procedures or the like may therefore be avoided or at least reduced, since the geometry of the interconnected encapsulants alone may define the plating area and the non-plating area. This enables the simple and quick formation of electrically conductive surface structures on a package, such as antenna structures and/or wiring connections for such antenna structure, EMI (electromagnetic interference) shielding structures, etc.

According to an exemplary embodiment of another aspect of the invention, a premix for a plateable encapsulant is provided based on which a plateable encapsulant can be easily produced by simply exposing and activating a transition metal forming part of this premix. Activation of the transition metal may involve a conversion of the transition metal into a charging state in which it significantly better electrically conductive than before the conversion, thereby rendering the activated transition metal capable of serving as a basis for a plating procedure, in particular an electroless plating procedure.

According to an exemplary embodiment of yet another aspect of the invention, a selectively activatable encapsulant is provided which is plateable when being activated, i.e. electrically conductive material can be deposited on the activated encapsulant by plating, in particular electroless plating. The actual encapsulation function can be accomplished by an electrically insulating (and preferably thermally conductive) encapsulant base material of the compound, whereas platability can be made possible by the plating catalyst (such as a transition metal) of the compound. In other words, the plating catalyst can catalyse the plating procedure when being activated, in particular when being brought in a highly electrically conductive (for instance metallic/electrically neutral) state.

Description of Further Exemplary Embodiments

In the following, further exemplary embodiments of the package, the method of manufacturing the package, the premix of the plateable encapsulant, the method of manufacturing the plateable encapsulant, the encapsulant, the method of manufacturing the encapsulant, and the method of use will be explained.

In the context of the present application, the term "package" may particularly denote at least one at least partially encapsulated semiconductor chip with at least one external electric contact.

In the context of the present application, the term "plating" may particularly denote surface covering or coating by which an electrically conductive material such as a metal is deposited on an at least partially electrically conductive surface. Plating may be electroplating or electroless plating. Electroless plating, which may also denoted as chemical or auto-catalytic plating, may be denoted as a non-galvanic plating method that involves reactions in a solution (in particular in an aqueous solution), which occur without the use of external electrical power.

In the context of the present application, the term "encapsulant" may particularly denote a substantially electrically insulating and preferably thermally conductive material surrounding (preferably hermetically surrounding) a semiconductor chip or the like in order to provide mechanical protection, electrical installation, and optionally a contribution to heat removal during operation. Such an encapsulant can be, for example, a mold compound or a laminate.

In the context of the present application, the term "plateable" may particularly denote a property of a base material on which electrically conductive material can be applied by plating, in particular by electroless plating. A plateable base may be provided from a material which comprises metallic particles, in particular in an electrically neutral state.

In the context of the present application, the term "non-plateable" may particularly denote a property of a base material on which electrically conductive material cannot be applied by plating, in particular by electroless plating. A non-plateable base may be provided from a material which is substantially electrically insulating.

In the context of the present application, the term "premix" of an encapsulant may particularly denote a material (such as a chemical composition) or another preform based on which an encapsulant, in particular a plateable encapsulant, can be manufactured.

In the context of the present application, the term "plating catalyst" may particularly denote a component of a compound used for manufacturing an encapsulant having the property of serving as a base for depositing electrically conductive material by plating. The plating catalyst may be the actual component which promotes the plating procedure, such as a transition metal.

In the context of the present application, the term "transition metal" may particularly denote an element whose atom has a partially filled d sub-shell, or which can give rise to cations with an incomplete d sub-shell. Examples for transition metals are palladium, copper or nickel.

In an embodiment, the package comprises at least one semiconductor chip at least partially embedded or encapsulated in the first encapsulant and/or the second encapsulant. Such a semiconductor chip may comprise a semiconductor substrate (such as a piece of silicon) in which at least one integrated circuit element (such as a transistor or a diode) is formed or integrated in an active region of the chip.

In an embodiment, the package comprises at least one antenna structure at least partially on and/or in at least one of the first encapsulant and the second encapsulant, in particular at least partially located at a surface of the package. Such an antenna structure may be a transmitter antenna capable of transmitting electromagnetic radiation, a receiver antenna capable of receiving electromagnetic radiation, or a transceiver antenna capable of transmitting and receiving electromagnetic radiation. Such an antenna structure may be electrically connected to the above-mentioned semiconductor chip which, in turn, may process a signal received by the antenna and/or may send a signal to the antenna forming the basis for transmitted electromagnetic radiation.

In an embodiment, at least one of the first encapsulant and the second encapsulant is a mold compound. In particular, the first encapsulant may be a mold compound with activated or activatable metallic particles (for instance electrically neutral metallic particles) in a mold matrix (for instance made of a polymer material). Additionally or alternatively, the second encapsulant may be a mold compound without metallic particles or with deactivated metallic particles (for instance electrically charged metallic particles) in a mold matrix (for instance made of a polymer material). As an alternative to a mold compound, any of the first encapsulant and the second encapsulant may be configured as a laminate.

In an embodiment, at least part of a surface (in particular an exterior surface) of the first encapsulant is plated with electrically conductive material.

In an embodiment, at least part of a lateral sidewall of the first encapsulant is plated with electrically conductive material. By merely carrying out an electroless plating procedure, a metallic coating will be formed only on the plateable encapsulant, not on the non-plateable encapsulant without the need of carrying out a patterning procedure.

In an embodiment, at least part of a planar wall of the first encapsulant is plated with a planar layer of electrically conductive material. Correspondingly, the activatable plating catalyst may be convertible into the activated state so that a planar wall of the encapsulant is plateable with a planar layer of electrically conductive material. Thus, both the planar wall as well as the planar layer (which may have a substantially homogeneous thickness) may be free of a curvature. Also, homogeneous plating may be enabled without the formation of pronounced indentations in a surface of the package.

In an embodiment, the plated electrically conductive material is configured for electrically connecting at least one semiconductor chip with at least one antenna structure of the package. By taking this measure, it becomes possible to form an electric wiring structure for electrically connecting at least one semiconductor chip of the package with at least one antenna structure.

In another embodiment, the plated electrically conductive material is configured for providing an electromagnetic interference shielding (EMI) of the package. Thus, EMI protection can be provided with small effort.

In yet another embodiment, the plated electrically conductive material is configured for electrically connecting at least one semiconductor chip with at least one solder pad of the package. This may render a via connection between solder pad and semiconductor chip dispensable.

In an embodiment, the package comprises at least one vertical through connection extending vertically through the first encapsulant. Such a via connection may connect, in one embodiment, an antenna structure with a semiconductor chip.

In an embodiment, at least part of the second encapsulant is configured as at least one vertically extending isolation bar vertically protruding into the first encapsulant, in particular at least one vertically extending isolation bar forming at least one corner section of the package. By such one or more isolation bars, which may protrude beyond a base portion of the second encapsulant, selective interruptions of plating around the first encapsulant may be defined.

In an embodiment, a surface (in particular a sidewall) of the first encapsulant is exposed before the plating (in particular is exposed by sawing) while the first encapsulant and the second encapsulant of the package are arranged on a temporary carrier. For exposing the sidewall of the first encapsulant for subsequent plating, at least the first encapsulant is directly sawn on a temporary carrier (such as a chemical resistance tape or UV foil). By taking this measure, the procedures of exposing and separating may be combined in a single procedure rather than in two separate procedures. This reduces the complexity of the manufacturing process.

In an embodiment, the package comprises at least one redistribution layer on and/or in the second encapsulant. The second encapsulant may hence serve as a redistribution layer and may translate between the tiny pads of the semiconductor chip and the larger dimensions of external electric contacts of a printed circuit board (PCB) or the like. In other words, the small dimensions of the chip world are transferred by the redistribution layer into the larger dimensions of the world of the mounting basis such as a PCB on which the electronic component or package may be mounted.

In an embodiment, the package comprises at least one solder structure on at least one of the first encapsulant and the second encapsulant. Via such a solder structure, a connection to a mounting base such as a printed circuit board may be established.

In an embodiment, the package is configured as a gesture sensor package. A gesture to be detected may result in a characteristic change of a signal detected by an antenna structure of the package. When a signal detected by the antenna structure is analyzed by the semiconductor chip in the package, information indicative of a gesture can be derived. An electric connection between the antenna structure and the semiconductor chip may be accomplished by a plating structure on an exterior surface of the first encapsulant.

In an embodiment, the plateable metal (such as a transition metal) comprises at least one material of a group consisting of, for example, palladium, nickel, copper, cobalt, silver. The transition metal may be provided in metallic form or in form of a metal compound, and in any desired charging state. However, other metals or metal compounds, in particular other transition metals, can be used as well.

In an embodiment, the coupling agent comprises at least one material of a group consisting of N (nitrogen) in particular from an amino group or an azole group, or C (carbon) in particular from a carbonyl group, and P (phosphor) in particular from an organophosphine group. The coupling agent may provide a coupling between the transition metal and the polymer cluster and may hence contribute to stability or integrity of the premix and the plateable encapsulant.

In an embodiment, the polymer cluster comprises at least one material of a group consisting of a wax, an adhesion promoter, a mold compound catalyst, and a coupling agent for silica. The polymer cluster may also comprise epoxy resin. The polymer cluster may contribute a mechanical protection function and an electrical insulation function to the encapsulant configured as plateable mold compound.

In an embodiment, the polymer cluster comprises at least one rest, in particular at least one of a hydrophobic group, and a hydrophilic group. Such hydrophilic and hydrophobic groups can passivate the transition metal in the deactivated state and can be removed selectively for exposing the transition metal for subsequent activation, followed by plating.

In an embodiment, the transition metal is provided in the premix or the encapsulant in a concentration in a range between 10 ppm and 10,000 ppm, in particular between 25 ppm and 2,000 ppm. It has turned out that even such small concentrations of transition metal allow the resulting encapsulant to be plated while simultaneously maintaining the substantial electrically insulating property of the encapsulant.

In an embodiment, the premix further comprises a complexing agent coupled to the transition metal. Such a complexing agent may be configured to enhance a chemical stearic effect. This allows to maintain the dielectric property of the encapsulant in the deactivated form.

In an embodiment, the method comprises using, as the transition metal-polymer compound, a premix having the above-mentioned features, i.e. comprising at least transition metal, coupling agent, and polymer cluster.

In an embodiment, the removing of a surface portion of the polymer cluster to thereby expose the transition metal is carried out by laser processing followed by an alkaline treatment (for instance using NaOH or KOH). Alternatively, the removing may be carried out by a plasma treatment (for instance by an argon plasma treatment). Further alternatively, a pure laser processing may accomplish the removing, for example using an argon gas laser. In yet another embodiment, laser processing (for instance using a high power laser) followed by chemical treatment (in particular by a weak base such as 3% to 15% monoethanolamine) can result in the removing.

In an embodiment, the plateable encapsulant and/or the non-plateable encapsulant comprises or consists of at least one of the group consisting of a mold compound and a laminate.

In an embodiment, the respective encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In another embodiment, the respective encapsulant comprises a mold, in particular a plastic mold. For instance, a correspondingly encapsulated chip may be provided by placing the electronic chip (if desired together with other components) between an upper mold die and a lower mold die and to inject liquid mold material therein. After solidification of the mold material, the package formed by the encapsulant with the electronic chip in between is completed. If desired, the mold may be filled with particles improving its properties, for instance its heat removal properties.

In an embodiment, the plating catalyst comprises a metallic material (such as palladium, Pd) being electrically insulating or poorly electrically conductive (for instance $Pd^{2+}$) in the deactivated state and being electrically conductive (for instance $Pd^0$) in the activated state.

In an embodiment, the encapsulant comprises an inactive material (which may be constituted by at least part of rest(s) of the polymer cluster and/or the complexing agent) covering the plating catalyst (such as a transition metal like palladium) in the deactivated state and being removable (for instance by a laser treatment and/or a plasma treatment) for exposing the plating catalyst for activation. Preferably, the inactive material is an electrically insulating inactive material.

In an embodiment, the method comprises removing at least part of the inactive material to thereby expose at least part of the plating catalyst for subsequently converting at least part of the plating catalyst from the deactivated state into the activated state. When a portion of the plating catalyst has been exposed by removing a section of the inactive material, it can be chemically activated by a conversion reaction. Such a conversion may result in an increase of the electrical conductivity of the exposed part of the plating catalyst, for instance from a poorly electrically conductive state (like palladium in an $Pd^{2+}$ state) into a metallically conductive state (like palladium in an $Pd^0$ state). The conversion reaction may hence be a chemical reduction, i.e. a change of the charging state of the plating catalyst.

In an embodiment, the removing comprises patterning the inactive material. For instance, such a patterning may be accomplished by a spatially limited laser treatment, or by a lithography and etching treatment.

In an alternative embodiment, the removing comprises converting part of the inactive material into non-plateable material (for instance by carbonizing hydrophilic and/or hydrophobic material), and removing a remaining non-converted part of the inactive material (for instance by etching or laser treatment) without removing the converted non-plateable material. This allows to expose part of the plating catalyst for subsequently converting this part of the plating catalyst from the deactivated state into the activated state. Again, such a conversion may result in an increase of the electrical conductivity of the exposed part of the plating catalyst, for instance from a poorly electrically conductive state (like palladium in an $Pd^{2+}$ state) into a metallically conductive state (like palladium in an $Pd^0$ state). The conversion reaction may hence be a chemical reduction, i.e. a change of the charging state of the plating catalyst.

In an embodiment, the converting of at least part of the plating catalyst comprises electrically neutralizing previously electrically charged metallic material of the plating catalyst. Such a chemical reaction may significantly increase electrical conductivity of the plating catalyst, thereby activating the plating catalyst and rendering it appropriate for depositing electrically conductive material thereon by plating.

In an embodiment, the electronic chip is a power semiconductor chip. In particular for power semiconductor chips, electric reliability and heat removal capability are important issues which can be met with the described manufacturing procedure. Possible integrated circuit elements which can be monolithically integrated in such a semiconductor power chip are field effect transistors (such as insulated gate bipolar transistors or metal oxide semiconductor field effect transistors) diodes, etc. With such constituents, it is possible to provide electronic components usable as packages for automotive applications, high-frequency applications, etc. Examples for electric circuits which can be constituted by such and other power semiconductor circuits and packages are half-bridges, full bridges, etc.

In an embodiment, the package comprises one or more solder structures (such as solder balls) on an exterior surface. Such a solder structure may allow to mount the package or electronic component on an external periphery device such as a printed circuit board.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments of the invention and constitute a part of the specification, illustrate exemplary embodiments of the invention.

In the drawings:

FIG. 4 illustrates cross-sectional views of structures obtained during carrying out a method of manufacturing a plateable encapsulant according to an exemplary embodiment.

FIG. 5 illustrates cross-sectional views of structures obtained during carrying out a method of manufacturing a plateable encapsulant according to another exemplary embodiment.

FIG. 6 illustrates cross-sectional views of structures obtained during carrying out a method of manufacturing a plateable encapsulant according to yet another exemplary embodiment.

FIG. 7 illustrates a package according to an exemplary embodiment.

FIG. 8 illustrates a package according to another exemplary embodiment.

DETAILED DESCRIPTION OF EXEMPLARY EMBODIMENTS

Figure 1:
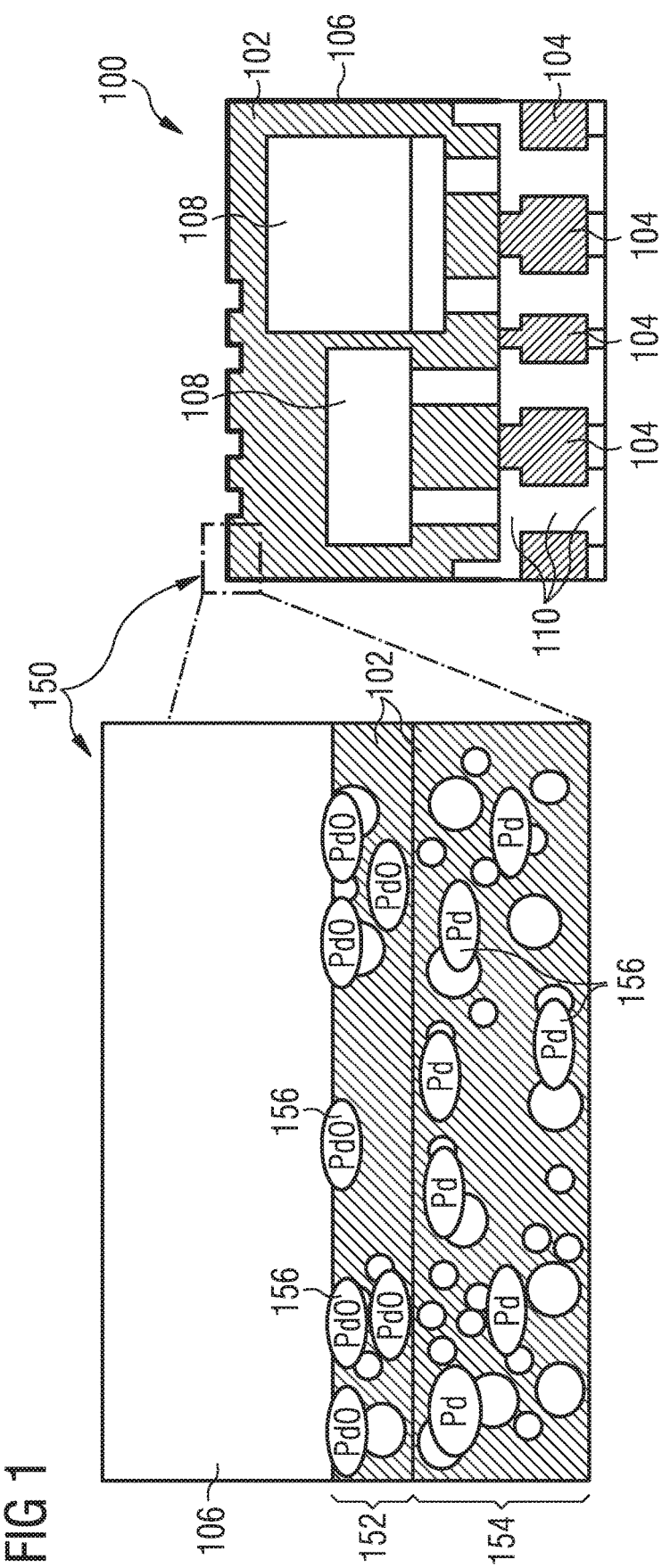
FIG. 1 illustrates a cross-sectional view and a detail of a package according to an exemplary embodiment.

The illustration in the drawing is schematically and not to scale.

Before exemplary embodiments will be described in more detail referring to the figures, some general considerations will be summarized based on which exemplary embodiments have been developed.

According to one aspect of the invention, a plateable encapsulant such as a plateable mold compound for semiconductor packages is provided.

Current plating technology on thermoset epoxy mold compound is not catalytically selective. This may cause plating not only on a substrate, but for example also on a jig and a carrier. Moreover, current plating technology on thermoset epoxy mold compound requires chemically roughening using high corrosive chemicals, such as desmear chemistry and glass etch chemistry, which may limit the selection of an appropriate material for carrier and jig.

According to another aspect of the invention, integration of an antenna structure in a semiconductor package is made possible. For this purpose, a plateable encapsulant may be advantageously used for rendering a semiconductor package more compact than possible with conventional approaches.

FIG. 1 illustrates a cross-sectional view and a detail 150 of a package 100 according to an exemplary embodiment.

The package 100 comprises a first mold compound as a first encapsulant 102 which is configured so that electrically conductive material 106 is plateable thereon. Moreover, the package 100 comprises a second mold compound as a second encapsulant 104 which is configured so that electrically conductive material 106 is not plateable thereon. Two semiconductor chips 108 are fully embedded in the first encapsulant 102. A lateral sidewall of the first encapsulant 102 is plated with electrically conductive material 106. Furthermore, the package 100 comprises a redistribution layer 110 on and in the second encapsulant 104 and being electrically coupled with the semiconductor chips 108. Via exposed surface portions of the redistribution layer 110, an electrically conductive coupling between the semiconductor chips 108 and an electronic periphery such as a printed circuit board (PCB, not shown) may be accomplished.

As can be taken from detail 150 in FIG. 1, a surface portion 152 (which may be denoted as activated portion or compound) of the first encapsulant 102 is activated for enabling plating of the electrically conductive material 106 thereon, whereas an interior portion 154 (which may be denoted as non-active epoxy mold portion or compound) of the first encapsulant 102 is deactivated for disabling plating of the electrically conductive material 106 thereon. The activated state corresponds to transition metal particles 156 being in an electrically conductive neutral charging state (palladium in the $Pd^0$ charging state in the shown embodiment, i.e. active palladium). The deactivated state corresponds to the transition metal particles 156 being in an electrically insulating or poorly conductive charging state (palladium in the $Pd^{2+}$ charging state in the shown embodiment, i.e. non-active palladium). The plated electrically conductive material 106 is a layer-type metallic coating which may be used for an electric ground connection.

In the shown embodiment it is not necessary to roughen the compound surface with corrosive chemical, by using laser roughing, mechanical sawing or proprietary adhesion promoter.

A selectivity area of plating in terms of the z-axis (i.e. the vertical axis according to FIG. 1), can be controlled by defining positions of the plateable first encapsulant 102 and of the non-plateable second encapsulant 104 and by a backside tape (for instance a chemical resistance tape).

The metallic catalyst in form of the transition metal particles 156, which may provide the first encapsulant 102 with a plateable property, may comprise or consists of active metallic particles (such as $Pd^0$) and none-active metallic particles (such as $Pd^{2+}$) within the package 100. Addition of a wax, adhesion promoter and/or catalyst is possible. The none-active metallic particles may comprise or consist of organo-metallic particles such as organo-palladium, organo-copper or organo-nickel. The total metallic amount of the first encapsulant 102 may be in a range from 0.05 weight % to 0.15 weight %. None-active organo-metallic particles may be ionized by a plasma such as Ar and/or $H_2$ plasma, for instance being operated for a time interval in a range between 5 minutes and 20 minutes, or more.

For patterned plating, selective laser treatment (in terms of activation) using for example a 1064 nm wavelength or a wavelength longer than 1064 nm with a pulse duration in the range of nanoseconds may be followed by an activation. Such an activation may be accomplished by an ionization process using alkaline base solution for example by adding 50 g/l to 70 g/l of NaOH or KOH. After that, the manufacturing method may proceed with the supply of a reducing agent. Subsequently, electroless plating may be carried out. Electroless plating on dicing tape enables package side wall plating without affecting the geometry of plating and the package saw cost. The described method is for instance applicable to an epoxy based mold compound using transfer molding.

Figure 2:
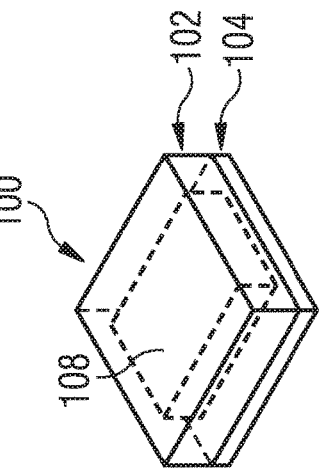
FIG. 2 illustrates a three-dimensional view of a package according to an exemplary embodiment.

FIG. 2 illustrates a three-dimensional view of a package 100 according to an exemplary embodiment, more specifically of the type described referring to FIG. 1. The package 100 according to FIG. 2 shows one semiconductor chip 108 encapsulated in a plateable first encapsulant 102 on top of a non-plateable second encapsulant 104.

Figure 3:
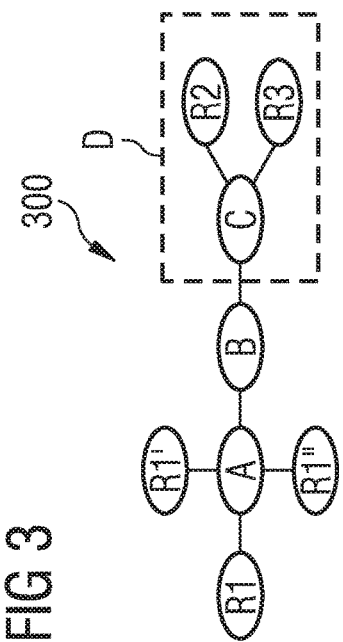
FIG. 3 illustrates the general chemical structure of a chemical component of a premix compound for forming a plateable encapsulant according to an exemplary embodiment.

FIG. 3 illustrates a general chemical structure of a chemical component of a compound forming the basis of a premix 300 for manufacturing a plateable encapsulant 102 according to an exemplary embodiment. In other words, the premix 300 may be used as a starting point for manufacturing the plateable encapsulant 102.

The premix 300 comprises a transition metal A (which may be present in organometallic form or bound in a compound), a polymer cluster D, and a coupling agent B coupling the transition metal A with the polymer cluster D. The transition metal A may comprise or consist of palladium, nickel and/or copper. The coupling agent B may comprise an N (nitrogen) from an amino group or an azole group, or a C (carbon) from a carbonyl group, or a P (phosphor) from an organophosphine group. The premix 300 moreover comprises a complexing agent which is here embodied in the form of three rests R1, R1', R1" coupled to the transition metal A. Alternatively, the complexing agent may comprise only one, only two or at least four rests. The complexing agent may be configured to enhance a chemical stearic effect. The polymer cluster D comprises in the shown embodiment a polymeric core C with two rests R2, R3. Alternatively, the polymer cluster D may comprise no rest, only one rest or at least three rests. For example, one of the rests R2 may be a hydrophobic group, and the other rest R3 may be a hydrophilic group. For example, the polymer cluster D may comprise a wax, an adhesion promoter, a mold compound catalyst and/or a coupling agent for silica.

A mold compound type encapsulant 102, which may be manufactured based on the premix 300 and which may be used for encapsulating semiconductor chip 108 may hence comprise an electrically insulating encapsulant base material in form of part C of the polymer cluster D, and an activatable plating catalyst in form of the transition metal A being convertible from a deactivated state, in which the encapsulant 102 is non-plateable with electrically conductive material 106, into an activated state, in which the encapsulant 102 is plateable with electrically conductive material 106. The plating catalyst in form of the transition metal A comprises a metallic material being electrically insulating or poorly conductive in the deactivated state and being electrically conductive in the activated state. An inactive material in form of at least part of the rests R1, R1', R1", R2, R3 may cover the plating catalyst A in the deactivated state and may be removable for exposing the plating catalyst in form of the transition metal A for activation. For example, this removing can be accomplished by a laser treatment and/or a plasma treatment.

The premix 300 of the plateable encapsulant 102 shown in FIG. 3 allows for semiconductor packaging with enable platability on a package body. This is achievable by a manufacturing method that enables to selectively activate an auto-catalytic procedure for electroless plating.

Hence, a process and an apparatus are provided which first use a thermoset mold material formulation comprising or consisting of a transition metal-polymer matrix to mold semiconductor package 100. The transition metal-polymer matrix may be composed of:

A=Transition metal, preferably Pd, Ni, and/or Cu, wherein the concentration of the transition metal may be in the range from 25 ppm to 2000 ppm B=Coupling agent between transition metal A and polymer cluster D (from wax component, mold compound catalyst, silica coupling agent), either N from amino group or azole group, C from carbonyl group and P from organophosphine group.

D=Polymer cluster (such as wax, adhesion promoter, mold compound catalyst, and/or coupling agent for silica)

R1, R1', R1"=Complexing agent preferably comprising or consisting of an aromatic ring to enhance a chemical stearic effect to maintain electrical insulative behavior of transition metal A in bulk mold compound.

R2=may be a hydrophobic group, hydrocarbon, either aliphatic or aromatic

R3=may be a hydrophilic group, carbonyl functional group, epoxy group or hydrophobic group hydrocarbon, either aliphatic or aromatic.

In one embodiment, a transition metal complex may be provided in wax (through carbonyl ester).

In another embodiment, a transition metal complex may be provided in a filler (for instance through amino base silane chemical).

In a further embodiment, a transition metal complex may be provided in a catalyst (for instance through amino base chemical or azole base or phosphine).

FIG. 4 illustrates cross-sectional views of structures obtained during carrying out a method of manufacturing a plateable encapsulant 102 according to an exemplary embodiment using a premix 300.

As can be taken from a schematically illustrated structure 400, a basis for the described method of manufacturing a plateable encapsulant 102 is the provision of a transition metal-polymer compound or premix 300 comprising transition metal A (in the shown embodiment palladium in a "2+" charging state) and a polymer cluster D composed of polymer core C and rests R2, R3. Also the above-described coupling agent (in the described embodiment only one rest R1) is provided. This results in the structure 400 which is schematically shown in FIG. 4 and comprises a mold compound 402 corresponding to polymer core C, the electrically charged transition metal A thereon, covered by a hydrophilic structure 404 and a hydrophobic structure 406 thereon. All or some of the rests R1, R2, R3 forming the hydrophilic structure 404 and the hydrophobic structure 406 serve as an inactive material covering the plating catalyst in form of the transition metal A in the deactivated state according to structure 400.

In order to obtain a structure 440, a surface portion of both the hydrophilic structure 404 and the hydrophobic structure 406 (i.e. a portion of the rests R2, R3 of the polymer cluster D as well as a portion of the rest R1) is removed to thereby pattern the hydrophilic structure 404 and the hydrophobic structure 406. Consequently, a portion of the transition metal A is exposed for subsequent activation and plating. To obtain structure 440, firstly a portion of the hydrophobic structure 406 is removed by laser processing to thereby obtain intermediate structure 420. Secondly, an exposed portion of the hydrophilic structure 404 is removed by treatment with an alkaline base such as NaOH or KOH to obtain structure 440. Hence, part of the inactive material R1, R2, R3 is removed to thereby expose part of the plating catalyst in form of the still deactivated transition metal A for subsequently converting part of the transition metal A from the deactivated state (palladium in the "2+" charging state) into the activated state (palladium in the "0" charging state).

The exposed surface of the transition metal A (palladium in the "2+" charging state) of the structure 440 can then be activated in terms of platability by a chemical reduction (thereby converting the palladium from the "2+" charging state into the electrically neutralized "0" charging state). By this activation, the palladium becomes properly electrically conductive and thereby becomes able to serve as a base for plating electrically conductive material 106 thereon, see structure 460. Consequently, the converting of part of the transition metal A for activation comprises electrically neutralizing previously electrically charged material of the transition metal A.

Thus, in order to obtain structure 460, the electrically conductive material 106 (for instance nickel) is formed by electroless plating on the exposed and activated surface of the transition metal A.

Summarizing, the activation and ionization process according to FIG. 4 can be carried out as follows:

By laser processing (preferably using a wavelength in a range from 1060 nm to 2700 nm) of structure 400, a portion of the hydrophilic structure 404 or hydrophilic component at the transition metal-polymer matrix is exposed, thereby obtaining structure 420. This is followed by an ionization using an alkaline base (for example NaOH or KOH) with a concentration of 30 g/l to 70 g/l to activate the transition metal-polymer matrix in the mold compound to enable the plating process.

FIG. 5 illustrates cross-sectional views of structures obtained during carrying out a method of manufacturing a plateable encapsulant 102 according to another exemplary embodiment.

As an alternative to the method described referring to FIG. 4, the method according to FIG. 5 uses an Ar containing plasma (for a batch procedure) or an Ar containing laser (when a selective area of the transition metal A shall be exposed). As a further alternative, one or more other noble elements/gases may be used. In order to obtain structure 440 based on structure 400 according to FIG. 5, an argon gas laser treatment may be carried out. In order to obtain structure 460 from structure 440 according to FIG. 5, a reduction and an electroless nickel deposition may be carried out.

As a further alternative to this, it is possible to use an Ar+$H_2$ plasma which can eliminate the necessity for a reduction process in plating.

FIG. 6 illustrates cross-sectional views of structures obtained during carrying out a method of manufacturing a plateable encapsulant 102 according to yet another exemplary embodiment.

In order to remove part of the hydrophilic structure 404 and of the hydrophobic structure 406, an inverse part of the inactive material in form of the rests R1, R2, R3 may be converted into non-plateable material by carbonization. Consequently, structure 600 with a carbonized structure as non-plateable material 602 is obtained. In order to obtain structure 620 according to FIG. 6, a remaining non-converted part of the inactive material in form of the rests R1, R2, R3 is removed to thereby completely remove the hydrophilic structure 404 and the hydrophobic structure 406. Thereby, structure 620 is obtained in which part of the transition metal A is exposed, whereas another part of the transition metal A remains covered with the converted non-plateable material 602. Subsequently, the exposed part of the transition metal A may be converted from the deactivated (in terms of platability) 2+ charging state into the activated (in terms of platability) electrically neutral charging state.

Alternatively to the methods described referring to FIG. 4 and FIG. 5, the method described referring to FIG. 6 relates to a deactivation process rather than to an activation process.

By using a high power laser, it is possible to carbonize the non-plating area on the package body, see transition from structure 400 to structure 600 according to FIG. 6. Subsequently, a chemical treatment can be carried out (for example with a weak base (such as monoethanolamine, preferably with a concentration of 3 volume % to 15% volume %)) to remove both remaining parts of the hydrophobic structure 406 and the hydrophilic structure 404 at the plating area on the package body, see transition from structure 600 to structure 620 according to FIG. 6. Reduction of the transition metal A from $Pa^{2+}$ to $Pa^0$ then enables a subsequent plating process, see transition from structure 620 to structure 640 in FIG. 6.

The plateable mold compound manufactured according to FIG. 4 to FIG. 6 can be used in combination with a non-plateable mold compound to create selectivity in plating in z-axis direction (i.e. in a vertical direction) and selectivity in x- and y-directions (i.e. in a horizontal plane) through laser activation or laser deactivation of transition metal A.

For example, the packages 100 shown in FIG. 7 to FIG. 11 can be obtained with such a combination of a plateable encapsulant 102 with a non-plateable encapsulant 104:

FIG. 7 illustrates a leadless package 100 according to an exemplary embodiment for RF front end module applications. The package 100 according to FIG. 7, which corresponds to package 100 according to FIG. 1, provides a solution for EMI (electromagnetic interference) shielding and/or ESD (electrostatic discharge) protection purpose due to the lining of an exterior surface of part of the package 100 with plated electrically conductive material 106.

FIG. 8 illustrates a package 100 according to another exemplary embodiment which is a miniaturized power package with high heat dissipation performance. The package 100 according to FIG. 8 has a heat sink 802 which is here embodied as a copper plate and which is thermally coupled to a copper interconnect in form of vias 800 on and in an epoxy mold compound surface. As can be taken from arrows 804, heat generated by the semiconductor chip 108 during operation can be spread and supplied to an environment of the package 100. According to FIG. 8, the plated electrically conductive material 106 also contributes to the efficient heat removal from the semiconductor chip 108 towards the environment of the package 100.

Figure 9:
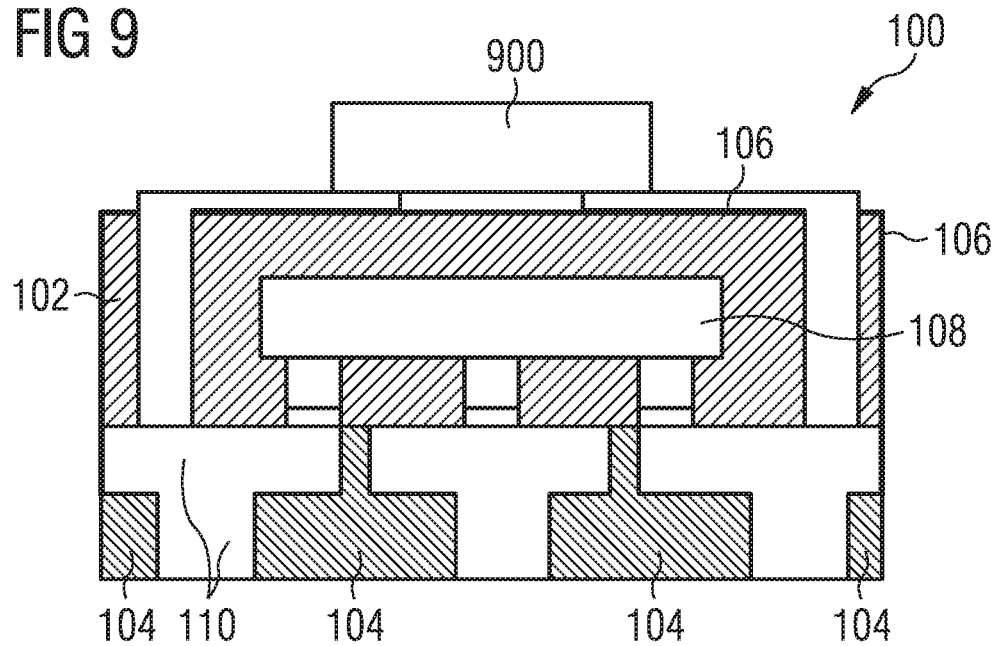
FIG. 9 illustrates a package according to still another exemplary embodiment.

FIG. 9 illustrates a package 100 according to yet another exemplary embodiment. FIG. 9 relates to a system-in-package (SIP) architecture with a copper interconnect on an epoxy mold compound surface. Package 100 according to FIG. 9 is a package-on-package arrangement, since a passive component 900 is mounted on the packaged semiconductor chip 108.

Figure 10:
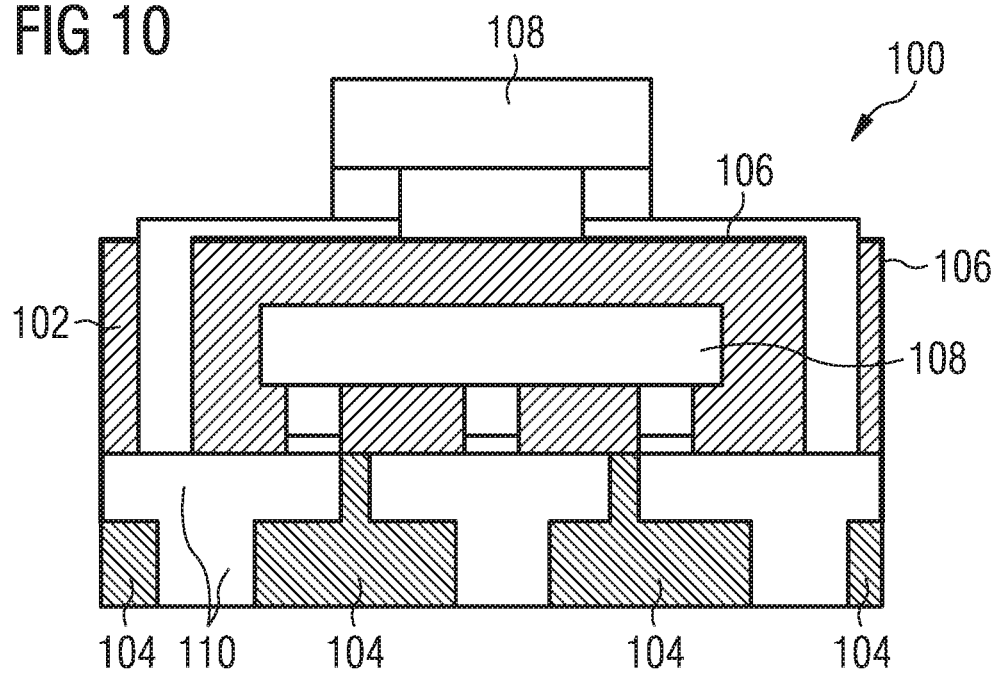
FIG. 10 illustrates a package according to yet another exemplary embodiment.

FIG. 10 illustrates an SIP package 100 according to still another exemplary embodiment. Package 100 according to FIG. 10 is an embodiment in accordance with wafer level packaging (WLP) technology. As in FIG. 9, plating by the electrically conductive material 106 is performed on the top surface of the mold compound.

Figure 11:
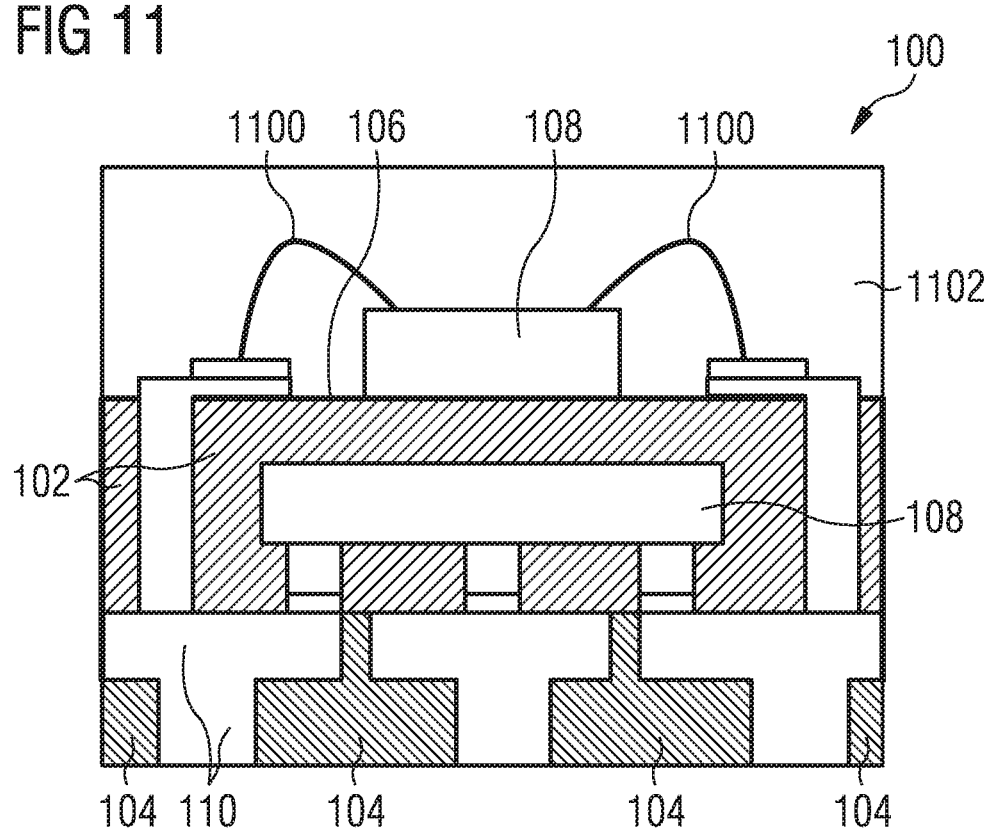
FIG. 11 illustrates a package according to another exemplary embodiment.

FIG. 11 illustrates an SIP package 100 according to another exemplary embodiment. In this embodiment, one semiconductor chip 108 is encapsulated in plateable encapsulant 102. A further semiconductor chip 108 is mounted on the plateable encapsulant 102, is electrically connected to the previously mentioned semiconductor chip 108 via bond wires 1100, and is subsequently encapsulated by a further encapsulant 1102. Hence, FIG. 11 corresponds to a chip embedded architecture with a copper interconnect on an epoxy mold surface.

Figure 12:
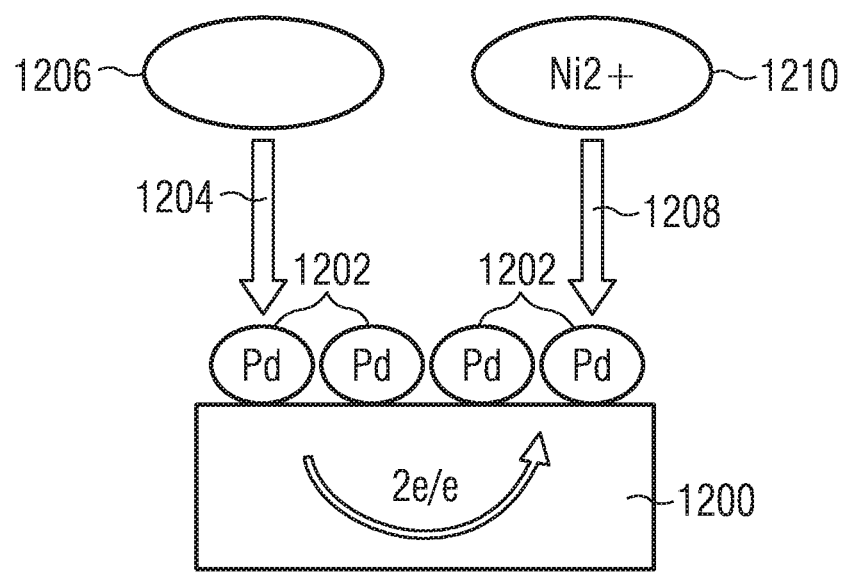
FIG. 12 schematically illustrates a process of plating a surface of a plateable encapsulant with electrically conductive material according to an exemplary embodiment.

FIG. 12 schematically illustrates a process of plating a surface of a plateable encapsulant 102 with electrically conductive material 106 according to an exemplary embodiment. Based on FIG. 12, an electroless plating mechanism implemented according to exemplary embodiments of the invention will be explained in the following in further detail. Reference numeral 1200 corresponds to an active compound, reference numeral 1202 corresponds to a transition metal such as palladium which can be treated (see reference numeral 1204) by a reduction agent 1206, which will be oxidized, and which can be treated (see reference numeral 1208) by a nickel ion 1210 such as $Ni^{2+}$, which will be reduced.

A process flow may be as follows:

1. An argon plasma or laser treatment may be used to remove a hydrophobic component of an organometallic which is attach to a wax, an adhesion promoter, a catalyst and coupling agent, etc.

2. Ionization of the organometallic can be carried out, for example by an Argon plasma or by NaOH.

3. Activation of the epoxy's compound organometallic may be carried out by reduction of ion novel metal by a reduction agent. An active surface may act as catalyst surface.

A corresponding chemical reaction can be:

$Pd^{2+}+Red \rightarrow Pd+O$

4. The active surface will become electrically conductive for electroless plating via catalyst by palladium, and it will go through a redox process in metal aqueous solution.

A chemical reaction regarding an oxidation of the reducing agent may be as follows:

$Red \rightarrow Ox+ne$

Reduction of nickel ion (catalysed by a catalyst) may be as follows:

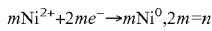

$mNi^{2+}+2me^- \rightarrow mNi^0, 2m=n$

Overall or sum reaction:

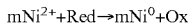

$mNi^{2+}+Red \rightarrow mNi^0+Ox$

Figure 13:
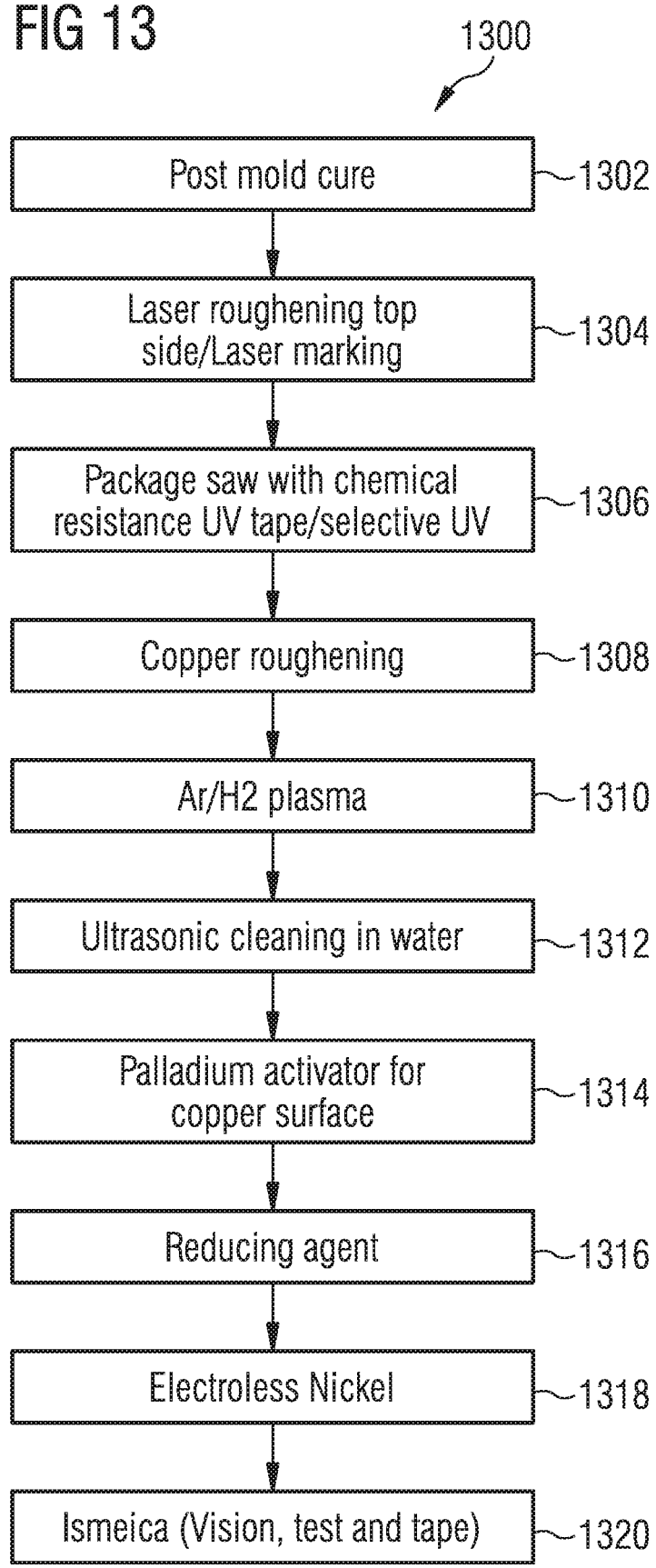
FIG. 13 illustrates a flowchart of a method of manufacturing a package according to an exemplary embodiment.

FIG. 13 illustrates a flowchart 1300 of a method of manufacturing a package 100 according to an exemplary embodiment. Full plating for EMI protection can be carried out.

In a block 1302, post mold curing is performed. In a subsequent block 1304, laser roughening on the top side and laser marking is carried out. In a subsequent block 1306, the package is sawn with a chemical resistance ultraviolet tape/selective ultraviolet treatment. Copper roughening is carried out in a subsequent block 1308. Subsequently, a plasma is applied (such as an argon and/or hydrogen plasma), see block 1310. In a subsequent block 1312, ultrasonic cleaning in water is carried out. In the following block 1314, a palladium activator for the copper surface is provided. In an optional subsequent block 1316, a reducing agent is added. Next, nickel is deposited in an electroless procedure, see block 1318. Finally, post processing can be carried out (see block 1320).

Figure 14:
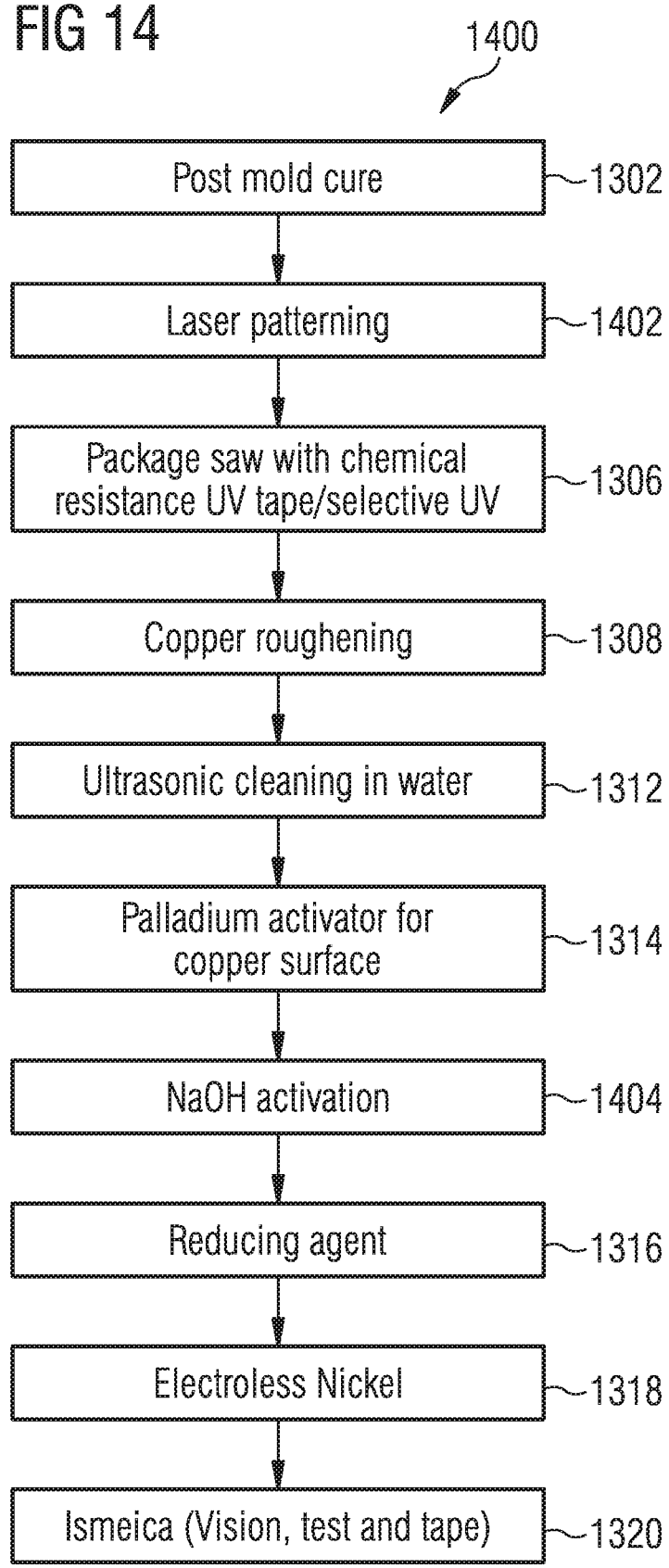
FIG. 14 illustrates a flowchart of a method of manufacturing a package according to another exemplary embodiment.

FIG. 14 illustrates a flowchart 1400 of a method of manufacturing a package 100 according to another exemplary embodiment. Selective plating can be carried out according to FIG. 14. In comparison to FIG. 13, block 1304 is substituted by a block 1402 in which laser patterning is carried out. While block 1310 is omitted according to FIG. 14, an additional block 1404 is interposed between block 1314 and block 1316. In block 1404, NaOH activation is carried out.

Figure 15:
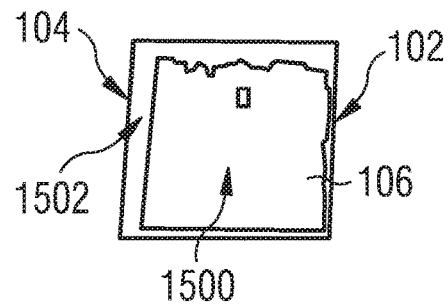
FIG. 15 illustrates a plated plateable encapsulant and a non-plated non-plateable encapsulant according to an exemplary embodiment.

FIG. 15 illustrates a plated plateable encapsulant 102 and a non-plated non-plateable encapsulant 104 according to an exemplary embodiment. Selective plating is accomplished by laser patterning according to FIG. 15 (in a similar way as shown in FIG. 4 and FIG. 5). This means that a so-called laser area 1500 irradiated with a laser is selectively activated and plated with electroless nickel as electrically conductive material 106. A non-laser area 1502 is not plated.

Figure 16:
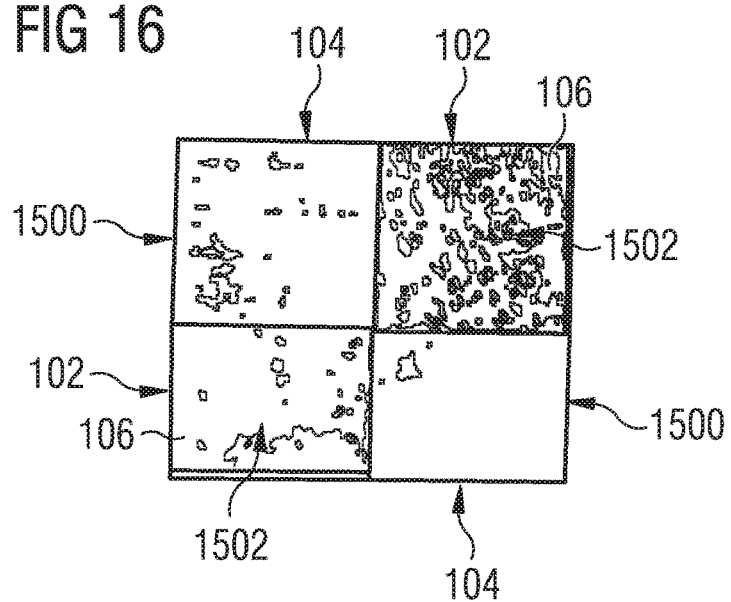
FIG. 16 illustrates a plated plateable encapsulant and a non-plated non-plateable encapsulant according to another exemplary embodiment.

FIG. 16 illustrates a plated plateable encapsulant 102 and a non-plated non-plateable encapsulant 104 according to an exemplary embodiment. According to FIG. 16, laser area 1500 is disabled with regard to plating by carbonization of laser area 1500 (in a similar way as shown in FIG. 6). In contrast to this, non-laser area 1502 is able to be covered with electrically conductive material 106 by electroless nickel plating, for instance by immersing the package body into an electroless nickel bath.

Figure 17:
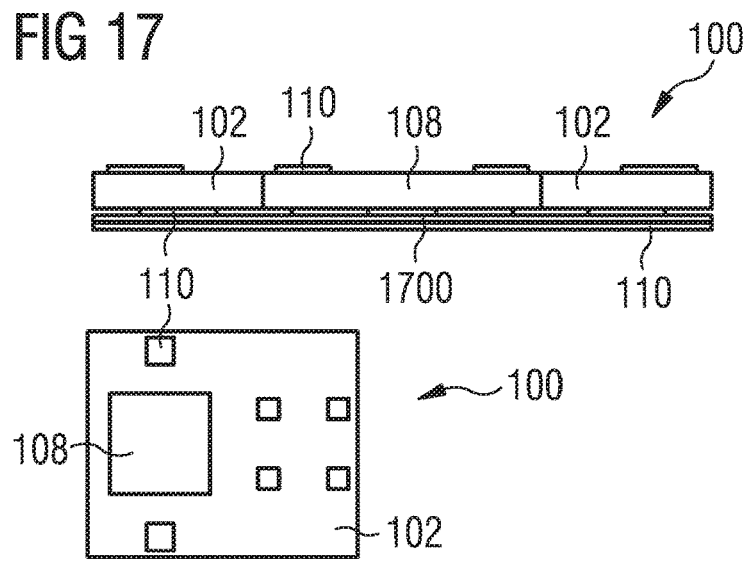
FIG. 17 illustrates a package according to an exemplary embodiment.

FIG. 17 illustrates a cross-sectional view and a top view of a package 100 according to an exemplary embodiment. The package 100 provides the function of a gesture sensor. A semiconductor chip 108 with a corresponding functionality is encapsulated in a plateable encapsulant 102. Both semiconductor chip 108 as well as plateable encapsulant 102 are arranged on a chip carrier 1700 such as a leadframe substrate. Redistribution layers 110 are provided both on bottom and on top of the semiconductor chip 108.

Figure 18:
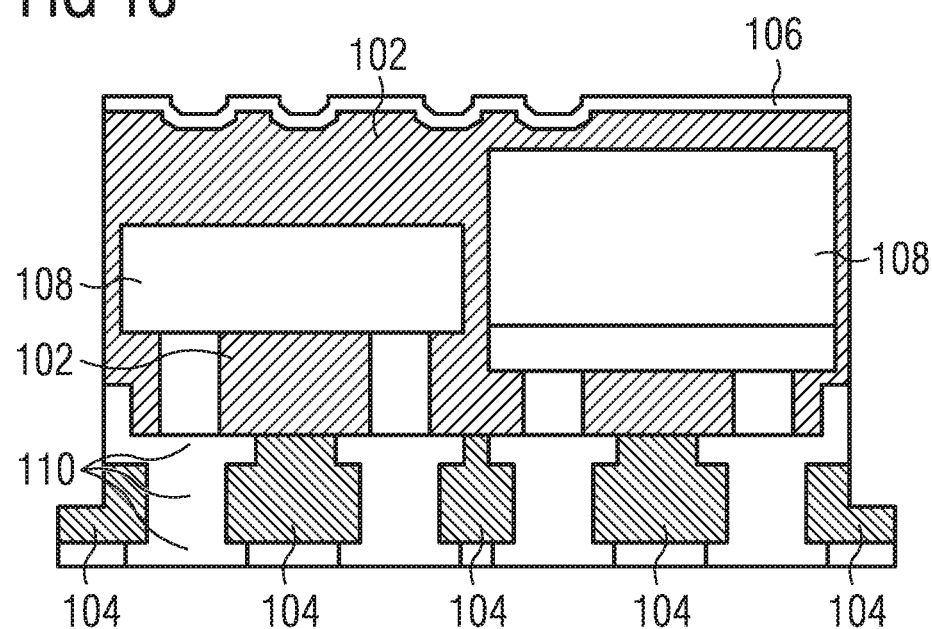
FIG. 18 illustrates a package according to another exemplary embodiment.

FIG. 18 illustrates a package 100 according to another exemplary embodiment with a top package surface plating in form of the electrically conductive material 106. FIG. 18 provides a solution to the transfer of electrical charge within the package 100. The plated electrically conductive material 106 contributes to reduce ESD (electrostatic discharge) issues.

Figure 19:
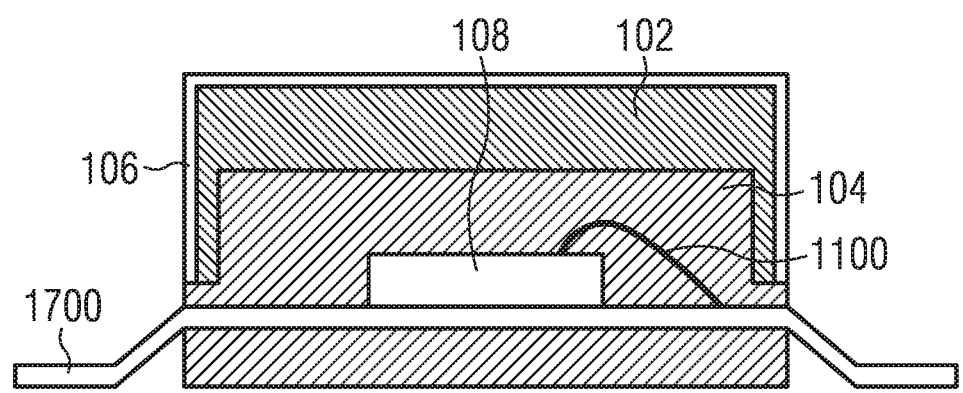
FIG. 19 illustrates a package according to still another exemplary embodiment.

FIG. 19 illustrates a package 100 according to an exemplary embodiment. The embodiment of FIG. 19 provides an EMI (electromagnetic interference) shielding for a leaded package 100, wherein the EMI protection is provided by the selectively plated electrically conductive material 106. According to FIG. 19, the semiconductor chip 108 is mechanically mounted on a chip carrier 1700 (such as a leadframe) and is electrically connected to the chip carrier 1700 by a bond wire 1100.

Figure 20:
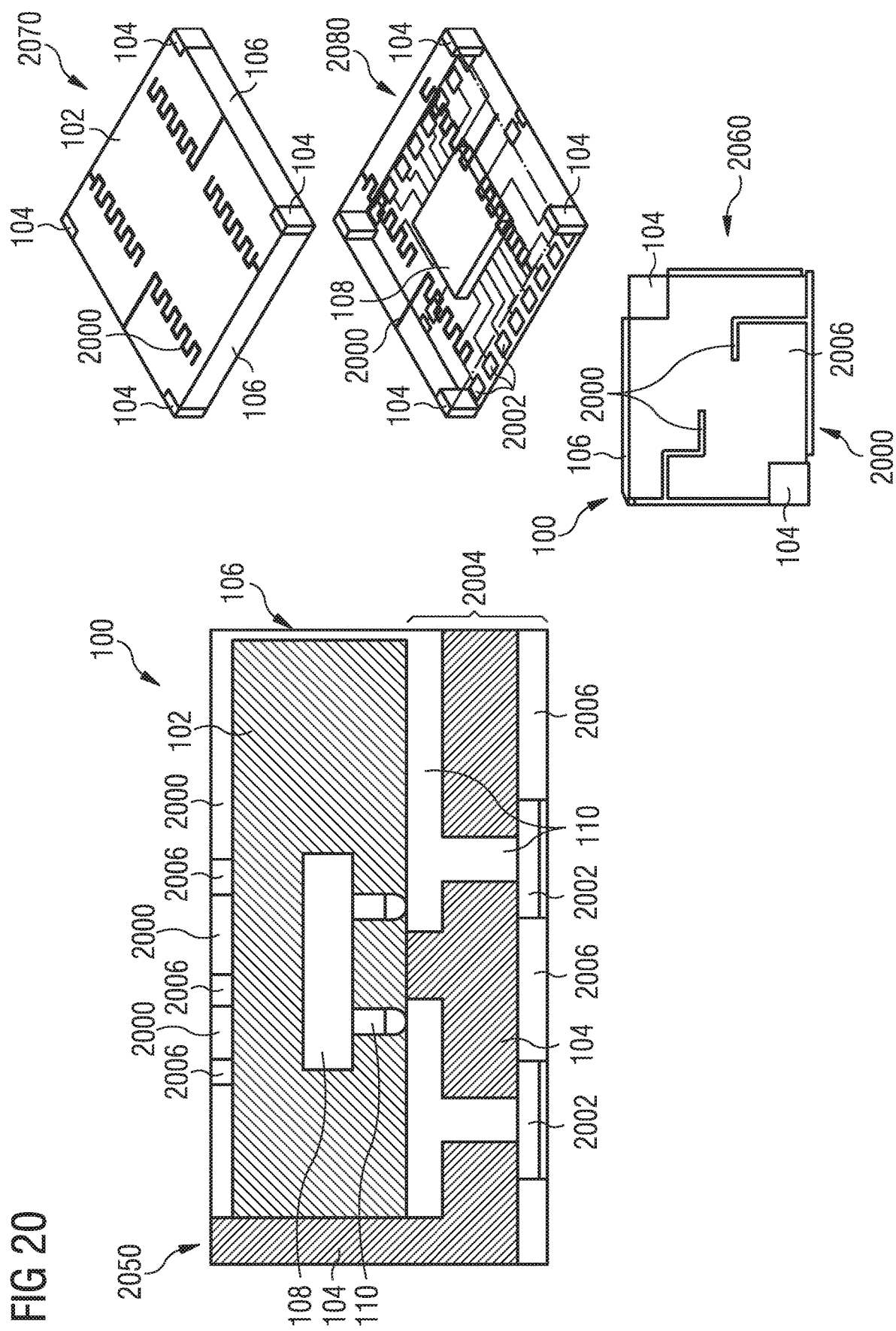
FIG. 20 illustrates a package with integrated antenna structure according to an exemplary embodiment.

FIG. 20 illustrates a package 100 with integrated antenna structure 2000 according to an exemplary embodiment. The package 100 is shown in FIG. 20 in a cross-sectional view 2050, in a plan view 2060, and—with a similar architecture—in a three-dimensional view 2070 and in a transparent three-dimensional view 2080. The package 100 is configured as a gesture sensor package 100. When a gesture is made, this characteristically influences an electric signal detected by the antenna structure 2000. More specifically, the antenna structure 2000 may be configured for receiving a radar signal. Hence, the event of a gesture can be detected by a semiconductor chip 108 which is electrically connected to the antenna structure 2000 via a sidewall plating in form of the electrically conductive material 106. The antenna structure 2000 is formed as a patterned electrically conductive layer on an upper main surface of the package 100.

According to FIG. 20, the antenna structure 2000 is arranged or integrated on a plateable first encapsulant 102 (for instance as described referring to FIG. 1 to FIG. 6) arranged above a substrate 2004 which, in turn, comprises a redistribution layer 110 embedded in a non-plateable second encapsulant 104 such as an ordinary mold compound (for instance being free of metallic particles). According to FIG. 20, the substrate 2004 comprises the redistribution layer 110, part of the non-plateable encapsulant 104, and a solder pad 2002 adjacent a solder mask 2006. According to FIG. 20, the antenna structure 2000 is located at an upper main surface of the package 100. A lateral sidewall of the first encapsulant 102 is plated with electrically conductive material 106 for electrically connecting the semiconductor chip 108 with the antenna structure 2000. A lateral sidewall of the non-plateable second encapsulant 104, which may include four isolation bars in four corners of the package 100 (see the three-dimensional views 2070, 2080), is free of electrically conductive material 106, since its surface is not plateable and is thus not covered with plated electrically conductive material 106 although being exposed during a plating procedure. Solder structure 2002, which is here embodied as a solder pad, is arranged on the second encapsulant 104. Solder masks 2006 are formed on an upper main surface of the first encapsulant 102 and on a lower main surface of the second encapsulant 104.

The substrate 2004 is a molded interconnect substrate with redistribution layer 110, solder structure 2002 connected to die pads 2010 via the redistribution layer 110, and the mold compound being of the none plateable type. There is a section of the second encapsulant 104 constituting a mold compound protrusion extending from and beyond the substrate 2004 as isolation bars for preventing metal plating at side walls in the four corners of the package 100. The semiconductor chip 108 is configured as a functional chip with attached die pad 2010 and is molded within the plateable first encapsulant 102 as plateable mold compound. Package 100 may be thinned down to expose the isolation bar(s). To obtain package 100, solder mask printing and curing may be carried out, as well as package singularization to expose the package sidewalls, followed by electroless plating.

Figure 21:
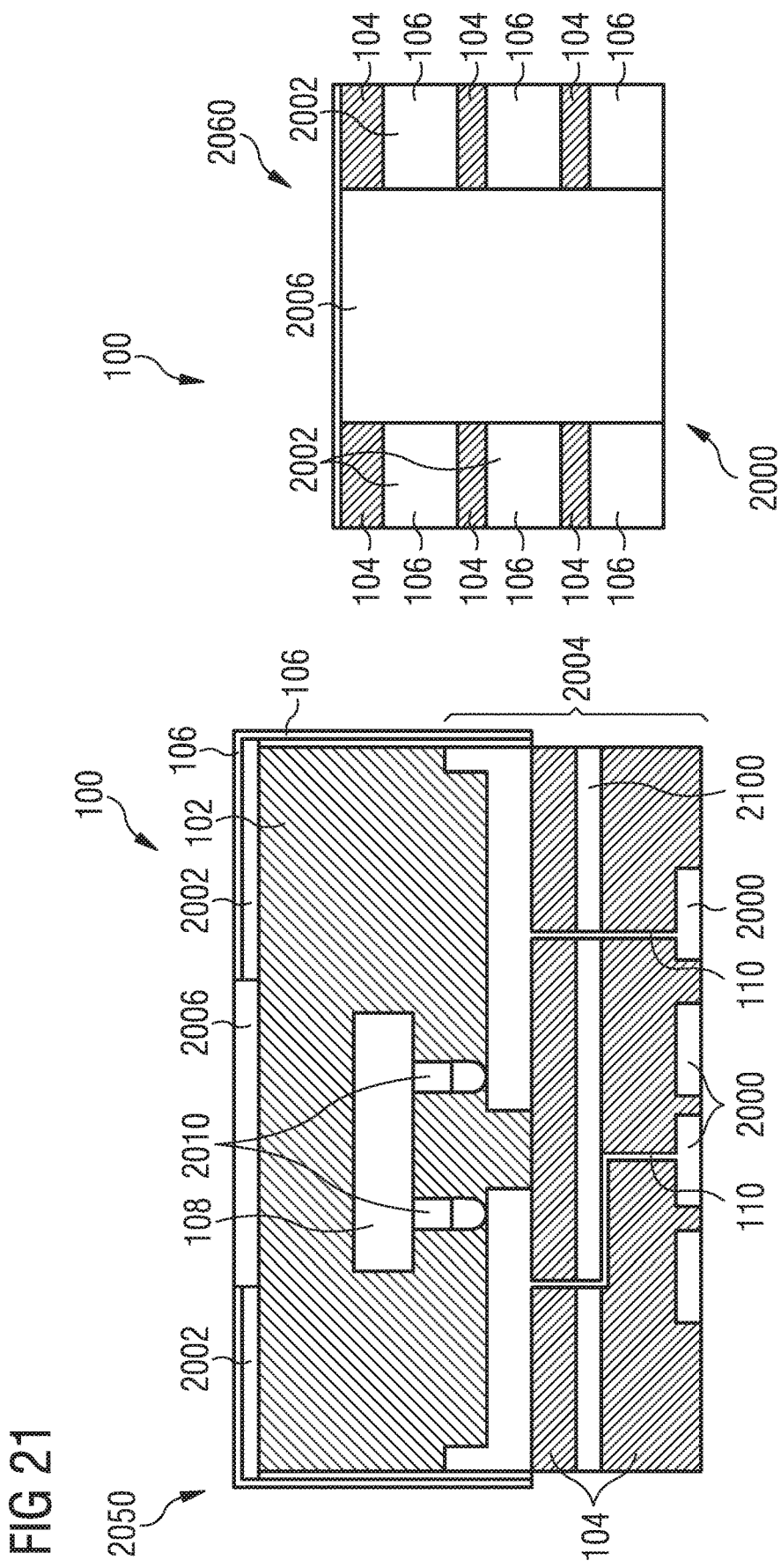
FIG. 21 illustrates a package with integrated antenna structure according to another exemplary embodiment.

FIG. 21 illustrates a package 100, also configured as a gesture sensor, with package-integrated antenna structure 2000 according to another exemplary embodiment.

In the embodiment of FIG. 21, the plated electrically conductive material 106 on sidewall portions of the plateable first encapsulant 102 are arranged for electrically connecting the semiconductor chip 108 with solder structures 2002 arranged on the top surface of the package 100. In other words, the sidewall plating is used for an interconnection from the semiconductor chip 108 to the solder structure 2002, configured as solder pad for providing a connection to a mounting base such as a printed circuit board (PCB, not shown). Furthermore, the antenna structure 2000 is provided as a patterned electrically conductive layer on a lower main surface of the non-plateable second encapsulant 104, and hence on a bottom surface of the package 100. Thus, the antenna structure 2000 is provided as a portion of the substrate 2004 according to FIG. 21. A dielectric layer 2100 separates and vertically spaces portions of the non-plateable second encapsulant 104.

The plateable first encapsulant 102 may comprise a dielectric material with a high dielectric constant. In the embodiment of FIG. 21, the substrate 2004 may be a premold including top stud, redistribution layer 110, and antenna structure 2000 with low dielectric constant. As can be taken from plan view 2060 of FIG. 21, portions of the non-plateable second encapsulant 104 may protrude vertically up to the upper main surface of the package 100, to thereby separate the individual solder structures 2002 formed on the plateable first encapsulant 102 by selective plating.

According to FIG. 21, the substrate 2004 comprises molded interconnect, redistribution layer 110, patterned antenna structure 2000, dielectric layer 2100, die pad 2010, and non-plateable mold compound in form of the second encapsulant 104. Sections of the non-plateable second encapsulant 104 of the substrate 2004 protrude as isolation bars for providing selectivity of side wall plating for the formation of the solder pads as solder structure 2002.

The semiconductor chip 108 is attached to die pad 2010 and encapsulated (here molded) with plateable mold compound in form of the first encapsulant 102. The package 100 may be thinned down to expose the isolation bar(s). It is furthermore possible to carry out solder mask printing and curing, package singulation to expose the package sidewall, followed by electroless plating.

Figure 22:
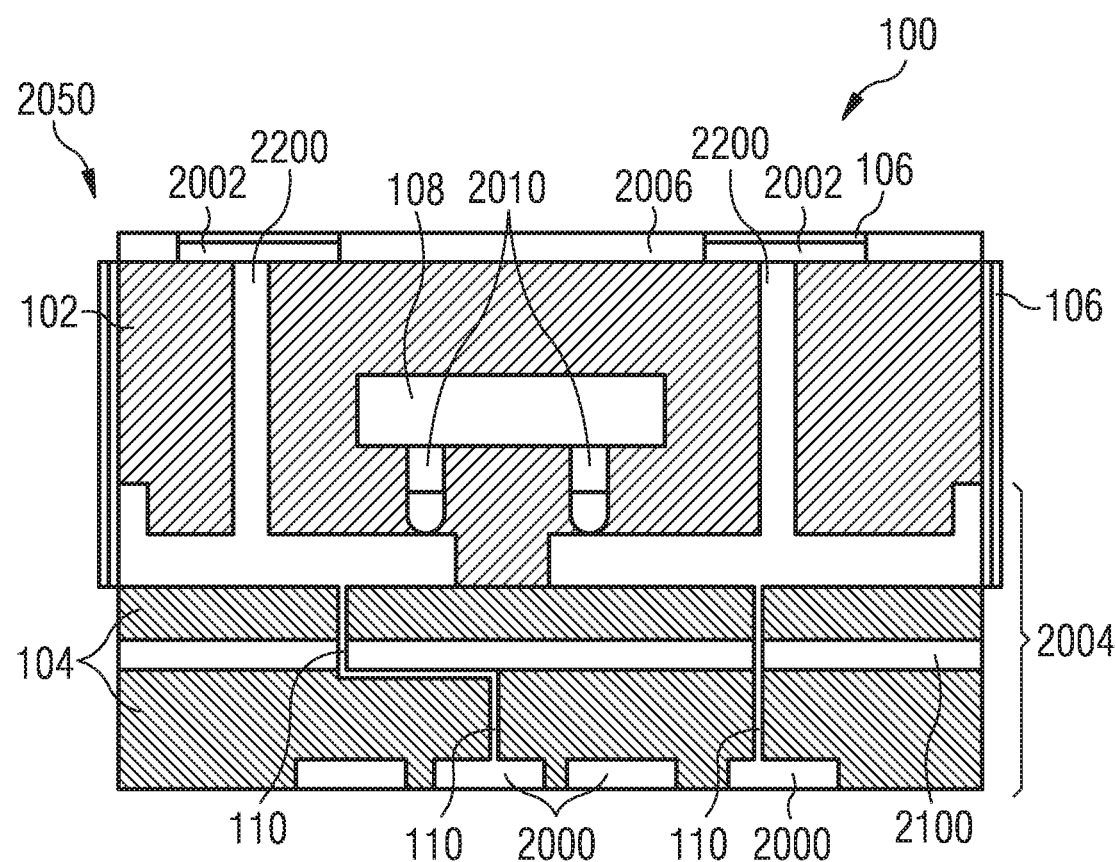
FIG. 22 illustrates a package with integrated antenna structure according to still another exemplary embodiment.

FIG. 22 illustrates a package 100 with an antenna structure 2000 formed as a patterned layer in a surface portion of a non-plateable second encapsulant 104 according to an exemplary embodiment.

In the embodiment of FIG. 22, the electrically conductive material 106 plated on exposed surface portions of the plateable first encapsulant 102 is configured for providing an electromagnetic interference (EMI) shielding of the package 100. Moreover, the package 100 according to FIG. 22 furthermore comprises vertical through connections 2200 (configured as vias i.e. through holes filled with electrically conductive material such as copper) extending vertically through the first encapsulant 102 for interconnecting solder structures 2002 via die pads 2010 to the semiconductor chip 108.

Hence, the embodiment of FIG. 22 comprises a substrate 2004 comprising molded interconnect, redistribution layer 110, antenna pattern, dielectric layer 2100, die pad 2010, and a mold compound being non-plateable. The substrate 2004 has portions of the non-plateable mold compound in form of the second encapsulant 104 protruding beyond a base portion of the second encapsulant 104 and extending into the plateable first encapsulant 102 to form isolation bars for defining a negative pattern for solder structures 2002 and for defining side wall plating. According to FIG. 22, the semiconductor chip 108 is attached to die pad 2010 and is encapsulated (more specifically molded) with plateable mold compound, i.e. with the plateable first encapsulant 102. To manufacture package 100 according to FIG. 22, laser drilling, solder mask printing and curing, plating on vias, and package singulation to expose the package sidewall are carried out, followed by electroless plating.

Figure 23:
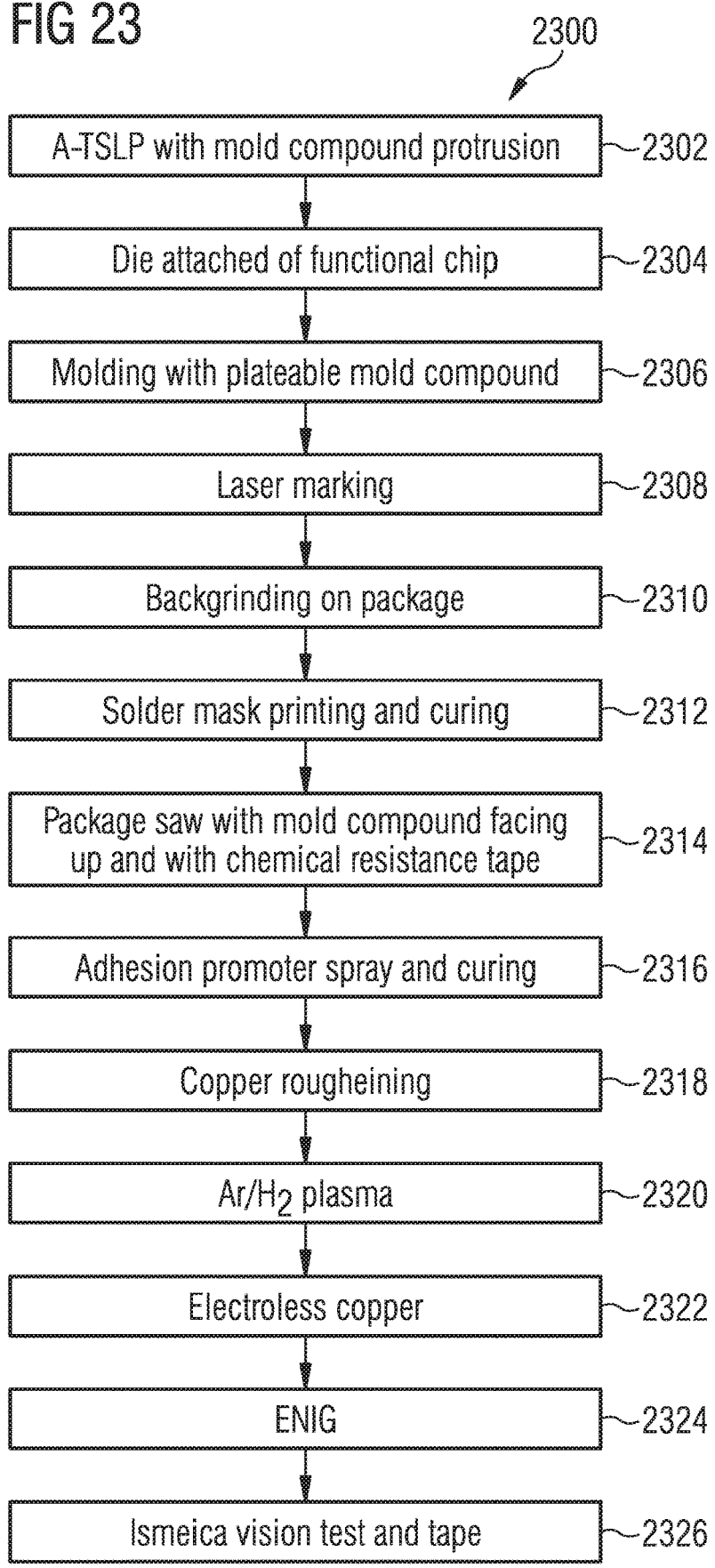
FIG. 23 illustrates a flowchart showing a method of manufacturing a package with integrated antenna structure according to an exemplary embodiment.

FIG. 23 illustrates a flowchart 2300 showing a method of manufacturing a package 100 with integrated antenna structure 2000 according to an exemplary embodiment.

As can be taken from block 2302, substrate 2004 can be manufactured with non-plateable mold compound protrusion (i.e. with the isolation bar(s)). As can be taken from a subsequent block 2304, semiconductor chip 108 can then be attached to the substrate 2004. As can be taken from a subsequent block 2306, the obtained structure may be molded with the plateable first encapsulant 102. As can be taken from a subsequent block 2308, laser marking can then be carried out. As can be taken from a subsequent block 2310, the obtained structure may be processed by backgrinding. As can be taken from a subsequent block 2312, a solder mask 2006 may then be printed and cured. As can be taken from a subsequent block 2314, the packages may then be sawn with mold compound facing up and with a chemical resistance tape. As can be taken from a subsequent block 2316, an adhesion promoter may be applied by spraying and may be cured. As can be taken from a subsequent block 2318, metal on the surface may be roughened. As can be taken from a subsequent block 2320, a plasma treatment may be carried out, for example by argon and/or hydrogen. As can be taken from a subsequent block 2322, a metal such as copper may be applied in an electroless plating procedure. As can be taken from a subsequent block 2324, a surface finish may be applied, for example ENIG (electroless nickel immersion gold). The resulting structure may be tested, see block 2326.

Figure 24:
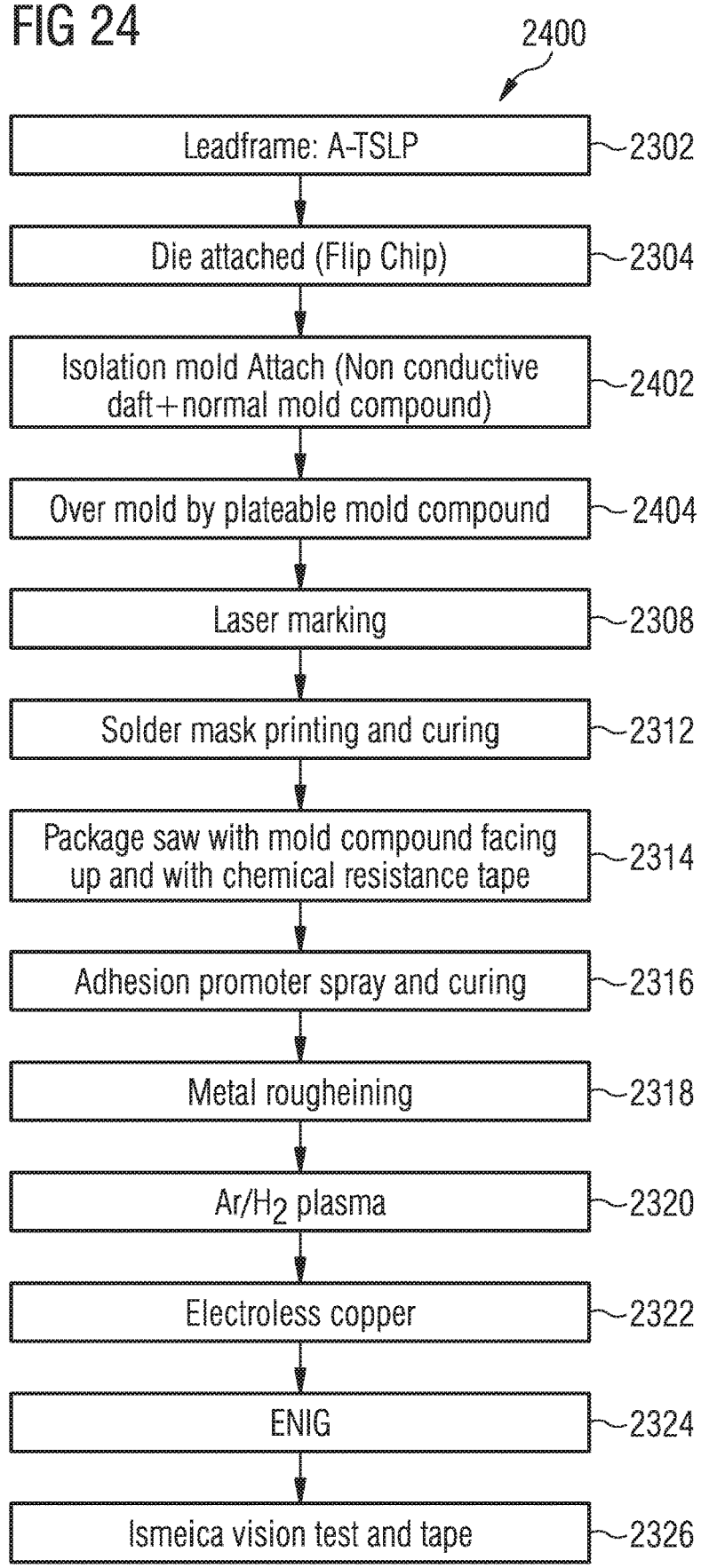
FIG. 24 illustrates a flowchart showing a method of manufacturing a package with integrated antenna structure according to another exemplary embodiment.

FIG. 24 illustrates a flowchart 2400 showing a method of manufacturing a package 100 with package-integrated antenna structure 2000 according to another exemplary embodiment.

As compared to the flowchart 2300, block 2306 is substituted by separate blocks 2402 and 2404 according to flowchart 2400. According to block 2402, an isolation mold attach procedure is carried out, followed by overmolding by a plateable mold compound (see block 2404).

FIG. 25 to FIG. 32 shows structures obtained during carrying out a method of manufacturing a package 100 according to an exemplary embodiment of the invention.

Figure 25:
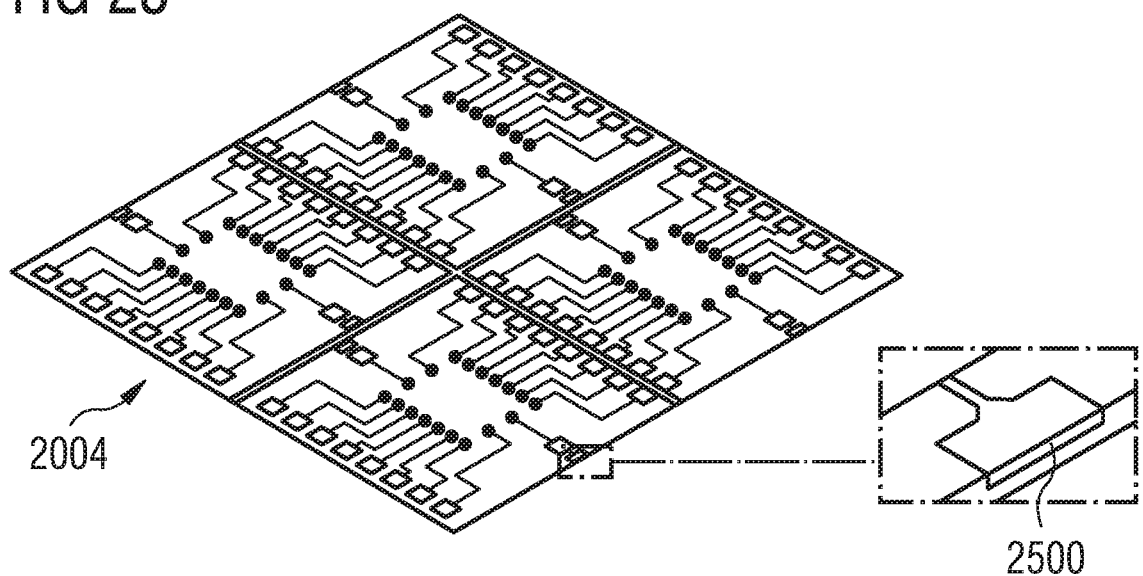
FIG. 25 to FIG. 32 shows structures obtained during carrying out a method of manufacturing a package according to an exemplary embodiment of the invention.

According to FIG. 25 (which corresponds to block 2302 in FIG. 24), substrate 2004 is provided on the basis of a leadframe. A connection trace 2500 on a side wall is shown in a detail of FIG. 25.

Figure 26:
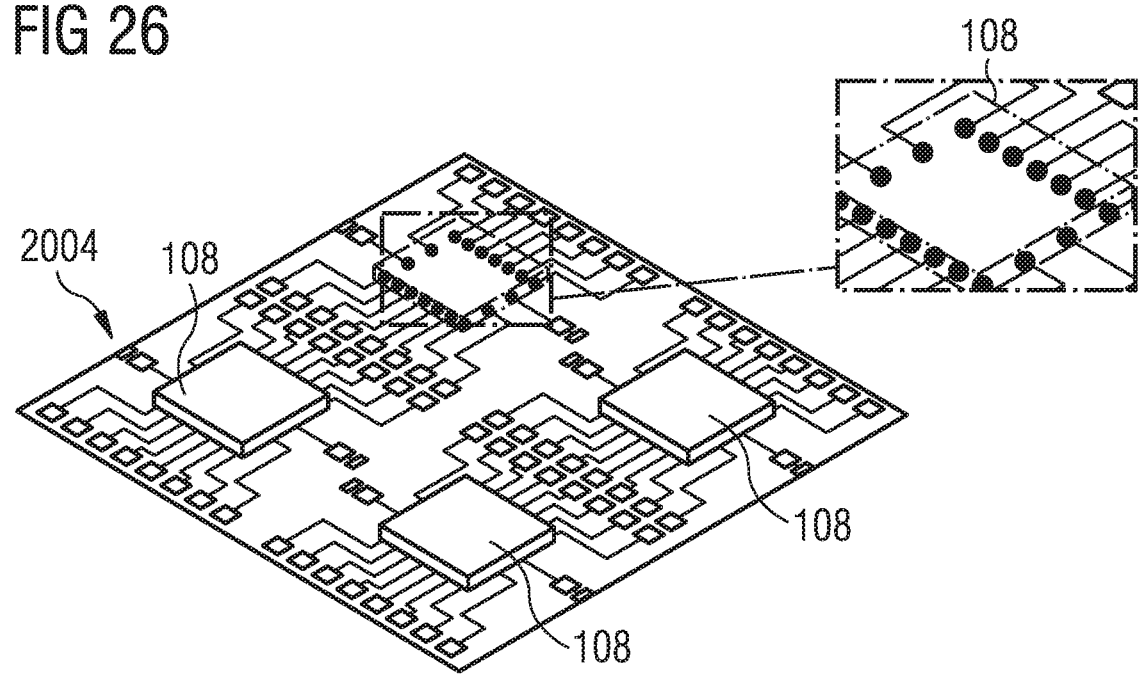

According to FIG. 26 (which corresponds to block 2304 in FIG. 24), semiconductor chips 108 are mounted in a flip chip architecture.

Figure 27:
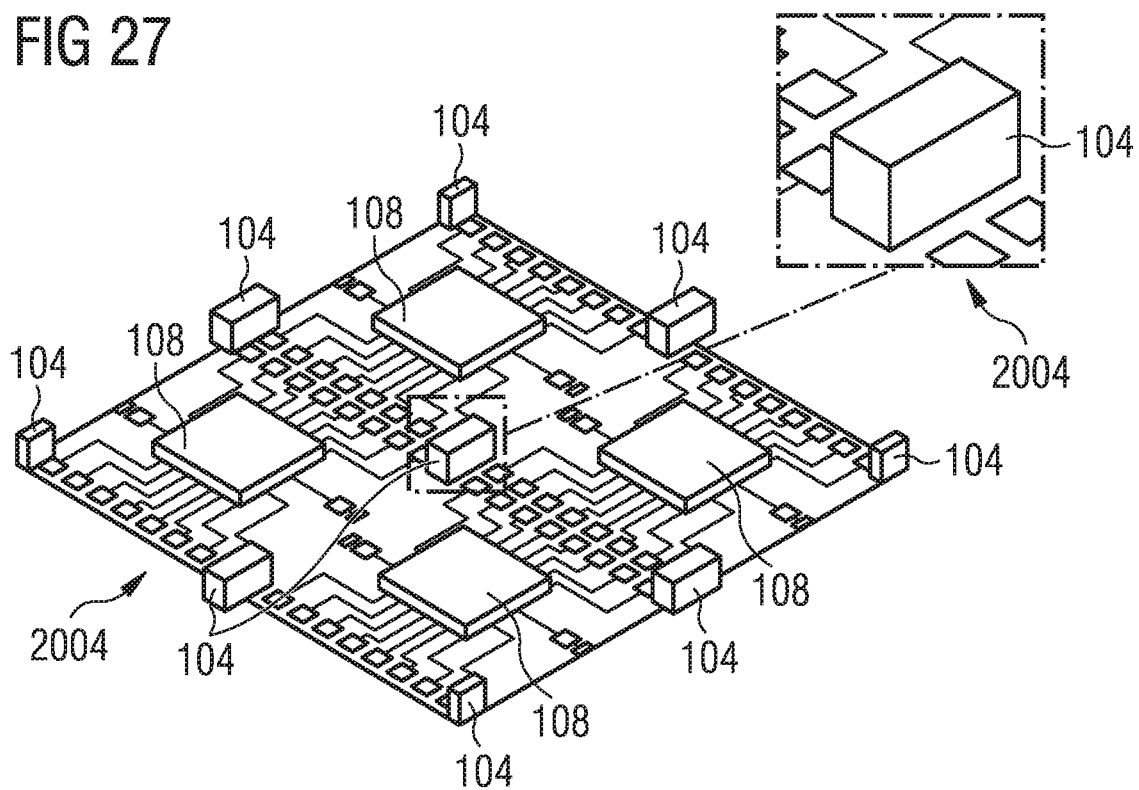

According to FIG. 27 (which corresponds to block 2402 in FIG. 24), isolation mold is attached. In other words, multiple isolation bars of non-plateable second encapsulant 104 are connected with the substrate 2004. For example, a dummy mold array may be formed and cut in small pieces which can be attached to the corresponding positions of the leadframe type substrate 2004.

Figure 28:
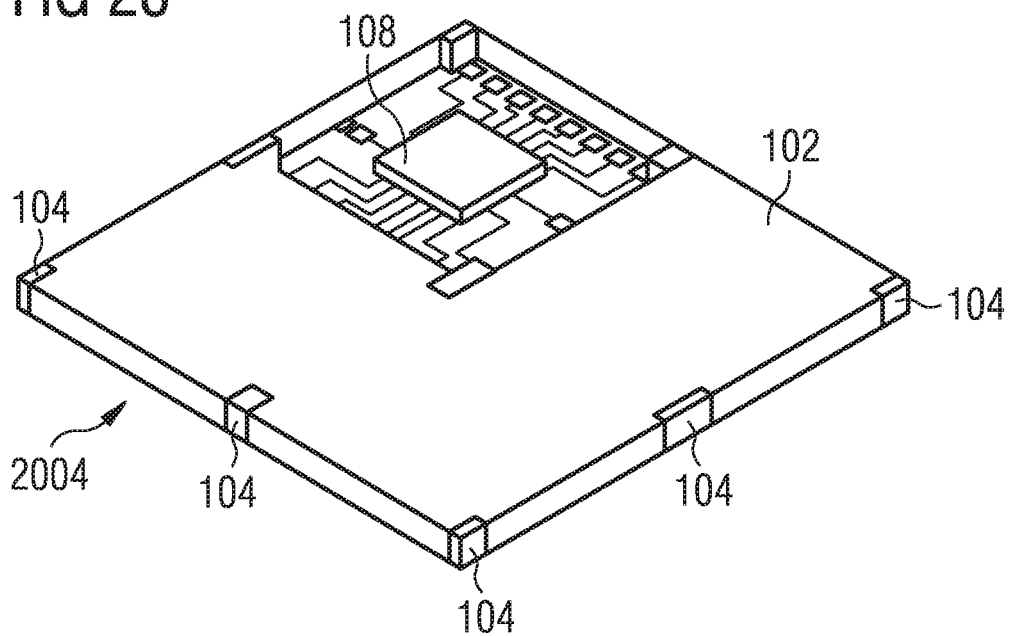

According to FIG. 28 (which corresponds to block 2404 in FIG. 24), the structure according to FIG. 27 is overmolded with plateable mold compound, i.e. with the plateable first encapsulant 102.

Figure 29:
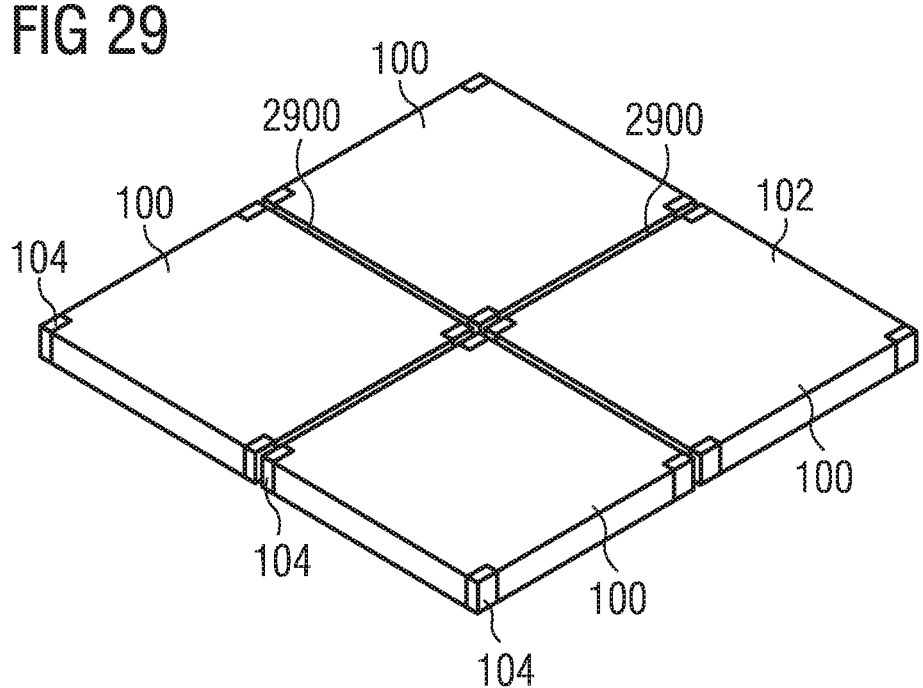

According to FIG. 29 (which corresponds to block 2314 in FIG. 24), the structure according to FIG. 28 is sawn along separation lines 2900 for singularising individual packages 100.

Figure 30:
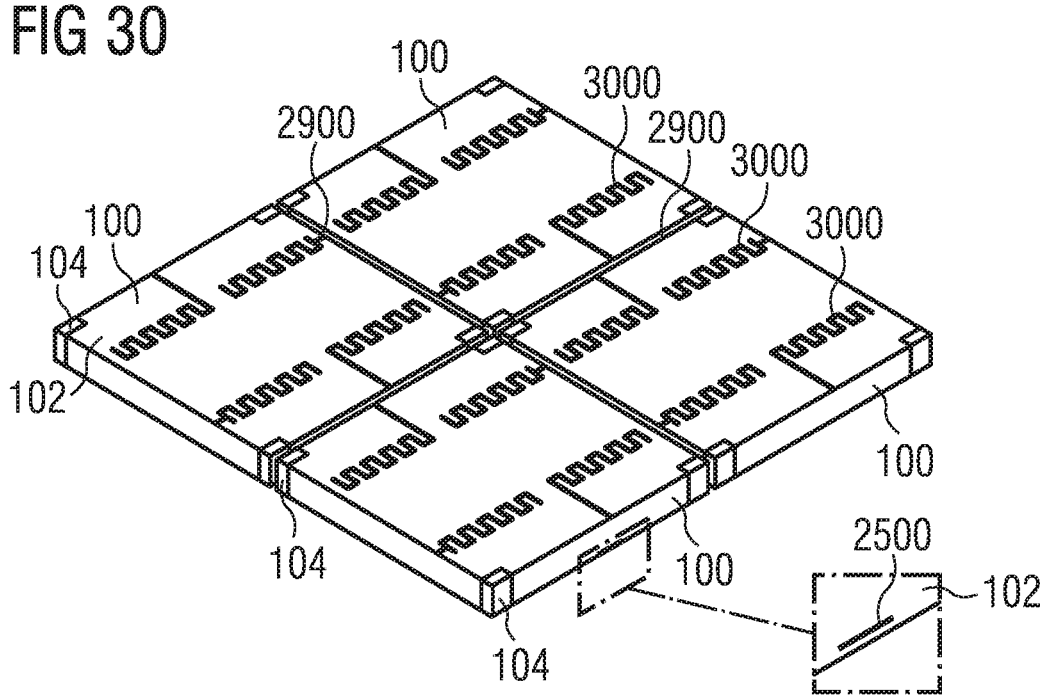

According to FIG. 30 (which corresponds to blocks 2316, 2318, 2320 in FIG. 24), a seeding procedure is carried out on the plateable first encapsulant 102. An adhesion promoter is applied and cured, metal is roughened, and the surface is activated by a plasma (such as an argon and/or hydrogen plasma). Activated sections of the first encapsulant 102 are indicated with reference numeral 3000.

Figure 31:
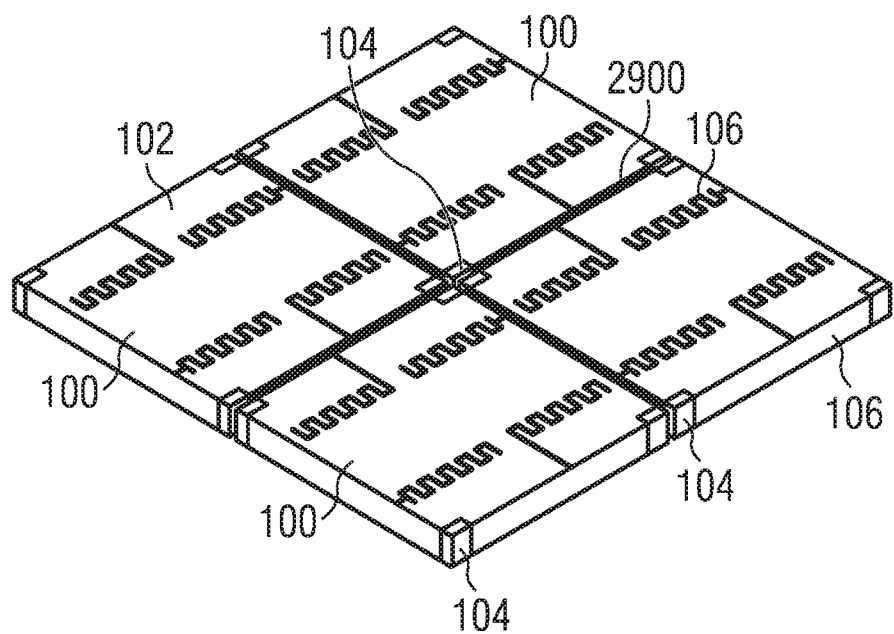

According to FIG. 31 (which corresponds to block 2324 in FIG. 24), the electrically conductive material 106 is applied to activated sections 3000 by electroless plating. Subsequently, an ENIG surface finish is applied.

Figure 32:
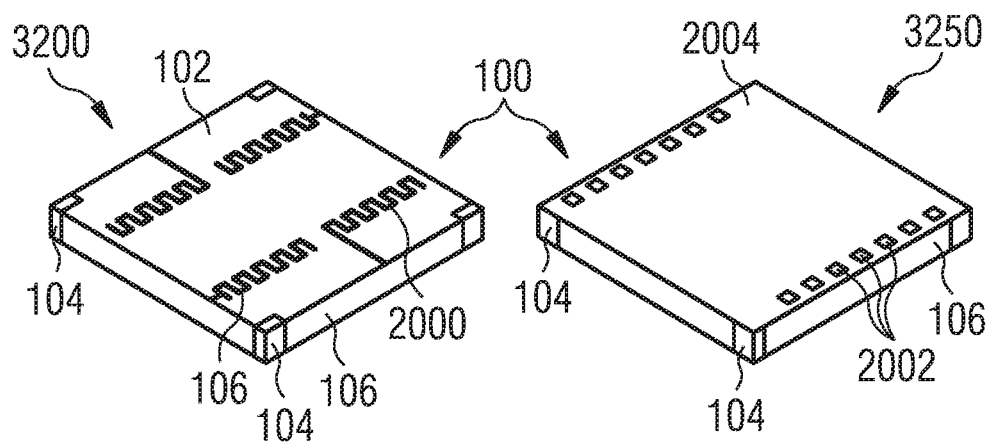

FIG. 32 shows a top view 3200 and a bottom view 3250 of the manufactured package 100.

FIG. 33 to FIG. 36 show structures of packages 100 according to embodiments of the invention. The illustrated embodiment relates to a patch antenna design (although other antenna designs are possible according to other exemplary embodiments of the invention).

Figure 33:
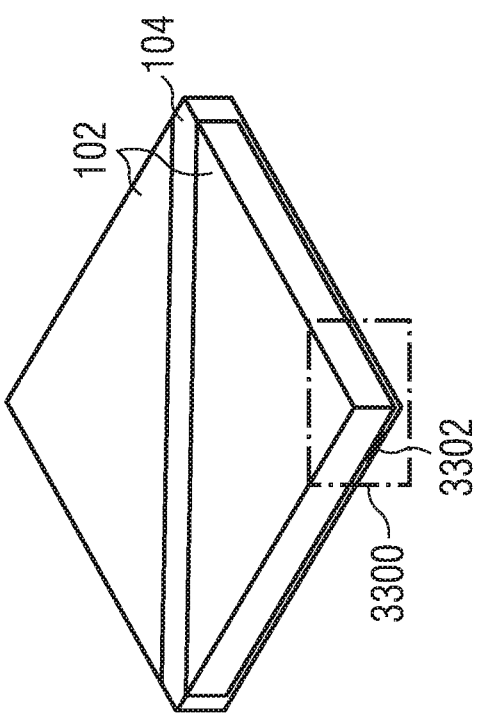
FIG. 33 to FIG. 36 show structures of packages according to embodiments of the invention.
Figure 34:
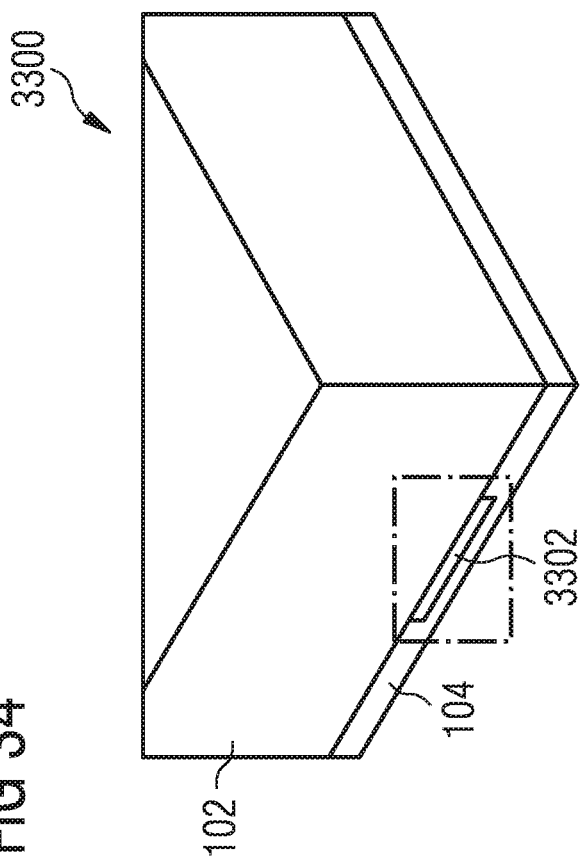

FIG. 33 shows a plateable first encapsulant 102 and a non-plateable second encapsulant 104 as well as a detail 3300 with an exposed trace 3302 for antenna connection. The structure shown in FIG. 33 relates to a condition before plating. FIG. 34 shows an enlarged view of detail 3300.

Figure 35:
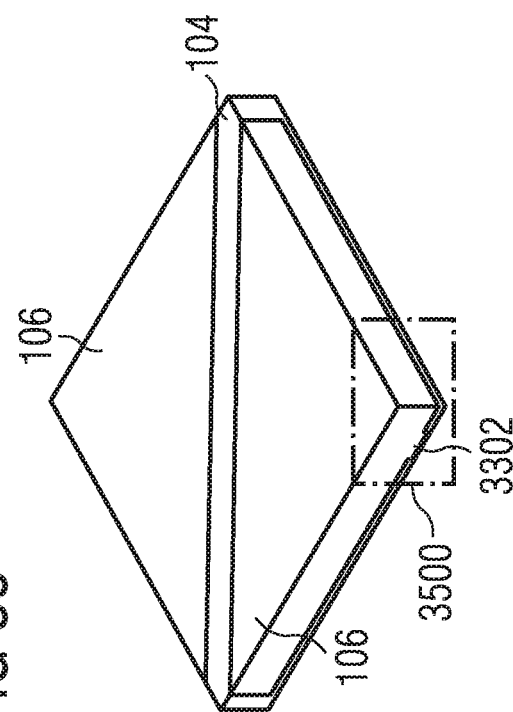
Figure 36:
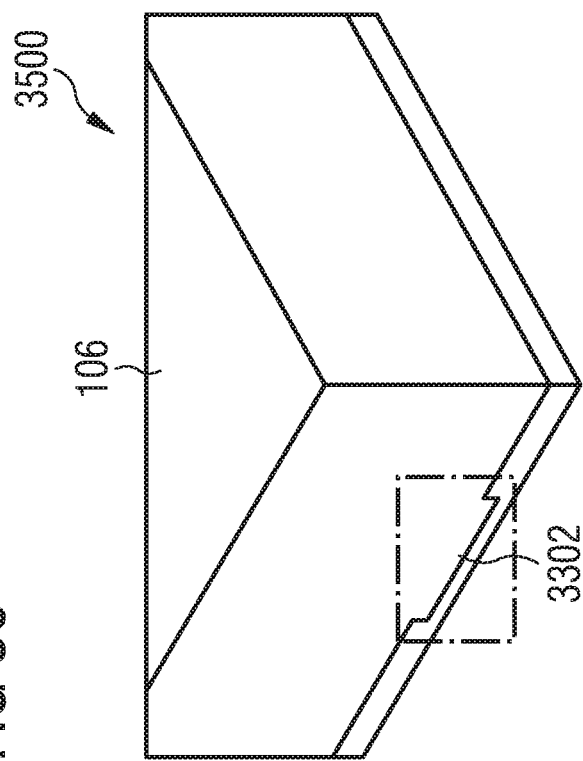

FIG. 35 shows the plateable first encapsulant 102 and the non-plateable second encapsulant 104 as well as a detail 3500 with the exposed trace 3302 for antenna connection after plating, i.e. of the applying electrically conductive material 106. FIG. 36 shows an enlarged view of detail 3500.

In the following exemplary Aspects are described:

Aspect 1. A package, comprising:
  a first encapsulant configured so that electrically conductive material is plateable thereon;
  a second encapsulant configured so that electrically conductive material is not plateable thereon.

Aspect 2. The package according to aspect 1, comprising at least one semiconductor chip at least partially encapsulated in the first encapsulant.

Aspect 3. The package according to aspect 1, comprising at least one antenna structure at least partially on and/or in at least one of the first encapsulant and the second encapsulant, in particular at least partially located at a surface of the package.

Aspect 4. The package according to aspect 1, wherein at least one of the first encapsulant and the second encapsulant is a mold compound, in particular a mold compound with activated or deactivated organometallic cluster component, more particularly organometallic polymer cluster component, in a mold matrix.

Aspect 5. The package according to aspect 1, wherein at least part of a surface of the first encapsulant is plated with electrically conductive material.

Aspect 6. The package according to aspect 5, comprising at least one of the following features:
  at least part of a lateral sidewall of the first encapsulant is plated with electrically conductive material;
  at least part of a planar wall of the first encapsulant is plated with a planar layer of electrically conductive material.

Aspect 7. The package according to aspect 5, wherein the plated electrically conductive material is configured for at least one of the group consisting of:
  for electrically connecting at least one semiconductor chip with at least one antenna structure;
  for providing an electromagnetic interference shielding of the package;
  for electrically connecting at least one semiconductor chip with at least one solder structure.

Aspect 8. The package according to aspect 1, wherein at least part of the second encapsulant is configured as at least one vertically extending isolation bar vertically protruding into the first encapsulant, in particular at least one vertically extending isolation bar forming at least one corner section of the package.

Aspect 9. A method of manufacturing a package, the method comprising:
configuring a first encapsulant so that electrically conductive material is plateable thereon;
configuring a second encapsulant so that electrically conductive material is not plateable thereon;
plating, in particular electroless plating, electrically conductive material selectively on a surface of the first encapsulant without plating electrically conductive material on a surface of the second encapsulant.

Aspect 10. The method according to aspect 9, wherein a surface, in particular a sidewall, of the first encapsulant is exposed before the plating, in particular is exposed by sawing while the first encapsulant and the second encapsulant of the package are arranged on a temporary carrier.

Aspect 11. A premix of a plateable encapsulant, the premix comprising:
a transition metal;
a polymer cluster; and
a coupling agent between the transition metal and the polymer cluster.

Aspect 12. The premix according to aspect 11, wherein the polymer cluster comprises at least one material of a group consisting of a wax, an adhesion promoter, a mold compound catalyst, and a coupling agent for silica.

Aspect 13. The premix according to aspect 11, wherein the polymer cluster comprises at least one rest, in particular at least one of a hydrophobic group, and a hydrophilic group.

Aspect 14. The premix according to aspect 11, further comprising a complexing agent coupled to the transition metal, in particular configured to enhance a chemical stearic effect to maintain an electrically insulating behaviour of the transition metal in a bulk mold compound.

Aspect 15. The premix according to aspect 11, wherein the transition metal is provided in a concentration in a range between 10 ppm and 10,000 ppm, in particular 25 ppm and 2,000 ppm.

Aspect 16. A method of manufacturing a plateable encapsulant, the method comprising:
providing a transition metal-polymer compound comprising a transition metal and a polymer cluster;
removing a surface portion of the polymer cluster, in particular a surface portion of the polymeric structure and of a complexing agent, to thereby expose the transition metal;
activating the exposed transition metal.

Aspect 17. The method according to aspect 16, wherein the method comprises using, as the transition metal-polymer compound, a premix according to aspect 10.

Aspect 18. An encapsulant for encapsulating a semiconductor chip, wherein the encapsulant comprises:
an electrically insulating encapsulant base material;
an activatable plating catalyst being convertible from a deactivated state, in which the encapsulant is non-plateable with electrically conductive material, into an activated state, in which the encapsulant is plateable with electrically conductive material.

Aspect 19. The encapsulant according to aspect 18, wherein the plating catalyst comprises a metallic material being electrically insulating in the deactivated state and being electrically conductive in the activated state.

Aspect 20. The encapsulant according to aspect 18, comprising an inactive material covering the plating catalyst in the deactivated state and being removable, in particular by at least one of the group consisting of a laser treatment and a plasma treatment, for exposing the plating catalyst for activation.

Aspect 21. The encapsulant according to aspect 18, wherein the activatable plating catalyst is convertible into the activated state so that a planar wall of the encapsulant is plateable with a planar layer of electrically conductive material.

Aspect 22. A method of manufacturing an encapsulant, wherein the method comprises:
providing a compound comprising an electrically insulating encapsulant base material and an activatable plating catalyst in a deactivated state, in which the compound is non-plateable with electrically conductive material;
converting at least part of the plating catalyst from the deactivated state into an activated state, in which the compound is plateable with electrically conductive material.

Aspect 23. The method according to aspect 22,
wherein the compound further comprises an inactive material covering the plating catalyst in the deactivated state;
wherein the method further comprises removing at least part of the inactive material to thereby expose at least part of the plating catalyst for subsequently converting at least part of the plating catalyst from the deactivated state into the activated state.

Aspect 24. The method according to aspect 23, wherein the removing comprises patterning the inactive material.

Aspect 25. The method according to aspect 23, wherein the removing comprises:
converting part of the inactive material into non-plateable material;
removing a remaining non-converted part of the inactive material to thereby expose part of the plating catalyst for subsequently converting part of the plating catalyst from the deactivated state into the activated state.

Aspect 26. The method according to aspect 22, wherein the converting of at least part of the plating catalyst comprises electrically neutralizing previously electrically charged metallic material of the plating catalyst.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of manufacturing a package, the method comprising:
embedding a semiconductor chip with an encapsulant comprising a transition metal in a concentration in a range between 10 ppm and 10,000 ppm,
wherein the encapsulant comprises a polymer cluster and a coupling agent between the transition metal and the polymer cluster;
selectively converting of a part of the transition metal, such that the electrical conductivity of the encapsulant increases; and
plating the converted part of the encapsulant with an electrically conductive material.

2. The Method according to claim 1, further comprising electrically coupling of a redistribution layer with the semiconductor chip.

3. The Method according to claim 1,
wherein the encapsulant is a mold compound.

4. The Method according to claim 1,
wherein the plating comprises a plating of an outer lateral sidewall of the converted part of the encapsulant with an electrically conductive material.

5. The Method according to claim 1,
wherein the sidewall of the encapsulant is exposed before the plating, in particular is exposed by sawing, while the encapsulant of the package is arranged on a temporary carrier.

6. The Method according to claim 1,
wherein the selectively converting of a part of the transition metal comprises a laser treatment.

7. The Method according to claim 1,
wherein the selectively converting of a part of the transition metal comprises a chemical reduction.

8. The Method according to claim 1,
wherein the plating is an electroless plating.

9. The Method according to claim 1,
wherein the transition metal is selected from one of the group consisting of palladium, nickel and copper.

10. The Method according to claim 1,
wherein the semiconductor chip is a power semiconductor chip.

11. The Method according to claim 1,
wherein an external periphery comprises a at least one of a printed circuit board, an antenna structure, a wiring connections for such an antenna structure, an EMI shielding structures and a passive component.

12. The Method according to claim 1,
coupling a complexing agent to the transition metal, in particular configured to enhance a chemical stearic effect to maintain an electrically insulating behaviour of the transition metal in a bulk mold compound.

13. The Method according to claim 1,
wherein the polymer cluster comprises at least one material of a group consisting of a wax, an adhesion promoter, a mold compound catalyst, and a coupling agent for silica.

14. The Method according to claim 1,
wherein the polymer cluster comprises at least one rest, in particular at least one of a hydrophobic group, and a hydrophilic group.

15. The Method according to claim 1, the method further comprising
removing a surface portion of the polymer cluster to thereby expose the transition metal;
activating the exposed transition metal.

16. The method according to claim 1, wherein the transition metal is presented in the form of organometallic compound.

17. A package, comprising:
at least one semiconductor chip; and
an encapsulant in which the semiconductor chip is embedded;
wherein the encapsulant comprises a transition metal in a concentration in a range between 10 ppm and 10,000 ppm,
wherein the encapsulant comprises a polymer cluster and a coupling agent between the transition metal and the polymer cluster,
wherein a part of the transition metal comprises a converted part configured for providing an electrical conductivity of the encapsulant,
wherein the converted part of the transition metal of the encapsulant is plated with an electrically conductive material.

* * * * *